(12) United States Patent
Ohnuma et al.

(10) Patent No.: US 9,917,274 B2
(45) Date of Patent: *Mar. 13, 2018

(54) LIGHT-EMITTING PANEL, LIGHT-EMITTING DEVICE USING THE LIGHT-EMITTING PANEL, AND METHOD FOR MANUFACTURING THE LIGHT-EMITTING PANEL

(71) Applicant: Semiconductor Energy Laboratory Co., Ltd., Kanagawa-ken (JP)

(72) Inventors: Hideto Ohnuma, Kanagawa (JP); Noriko Miyairi, Kanagawa (JP); Naoyuki Senda, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/351,748

(22) Filed: Nov. 15, 2016

(65) Prior Publication Data

US 2017/0062754 A1    Mar. 2, 2017

Related U.S. Application Data

(63) Continuation of application No. 14/858,282, filed on Sep. 18, 2015, now Pat. No. 9,502,676, which is a (Continued)

(30) Foreign Application Priority Data

Jun. 24, 2011 (JP) .................................. 2011-141001

(51) Int. Cl.
*H01L 51/52* (2006.01)
*H01L 27/32* (2006.01)
(Continued)

(52) U.S. Cl.
CPC ........ *H01L 51/5206* (2013.01); *H01L 27/326* (2013.01); *H01L 27/3246* (2013.01); (Continued)

(58) Field of Classification Search
CPC . H01L 51/5206; H01L 51/52; H01L 51/5012; H01L 27/326; H01L 27/3246
See application file for complete search history.

(56) References Cited

U.S. PATENT DOCUMENTS 6,541,918 B1    4/2003  Yudasaka
6,739,931 B2    5/2004  Yamazaki et al.
(Continued)

FOREIGN PATENT DOCUMENTS

CN    001269042 A    10/2000
EP    0 989 534 A1    3/2000
(Continued)

*Primary Examiner* — Jose R Diaz
(74) *Attorney, Agent, or Firm* — Husch Blackwell LLP

(57) ABSTRACT

To provide a light-emitting panel in which the occurrence of crosstalk is suppressed. To provide a method for manufacturing a light-emitting panel in which the occurrence of crosstalk is suppressed. The light-emitting panel includes a first electrode of one light-emitting element, a first electrode of the other light-emitting element, and an insulating partition which separates the two first electrodes. A portion with a thickness $A_1$ smaller than a thickness $A_0$ of a portion of the layer containing a light-emitting organic compound, which overlaps with a side surface of the partition, is included. The ratio $(B_1/B_0)$ of a thickness $B_1$ of a portion of the second electrode, which overlaps with a side surface of the partition, to a thickness $B_0$ of a portion of the second electrode, which overlaps with the first electrode, is higher than the ratio $(A_1/A_0)$.

20 Claims, 10 Drawing Sheets

Related U.S. Application Data continuation of application No. 13/527,923, filed on Jun. 20, 2012, now Pat. No. 9,142,598.

(51) Int. Cl.
*H01L 51/00* (2006.01)
*H01L 51/50* (2006.01)
*H01L 51/56* (2006.01)

(52) U.S. Cl.
CPC ...... *H01L 51/0002* (2013.01); *H01L 51/0021* (2013.01); *H01L 51/0085* (2013.01); *H01L 51/5012* (2013.01); *H01L 51/52* (2013.01); *H01L 51/5203* (2013.01); *H01L 51/5221* (2013.01); *H01L 51/56* (2013.01); *H01L 51/006* (2013.01); *H01L 51/0052* (2013.01); *H01L 51/0054* (2013.01); *H01L 51/0058* (2013.01); *H01L 51/0072* (2013.01); *H01L 51/0074* (2013.01); *H01L 2251/558* (2013.01)

(56) References Cited

U.S. PATENT DOCUMENTS

| | | | |
|---|---|---|---|
| 6,828,727 B2 | 12/2004 | Yamazaki | |
| 6,995,511 B2 | 2/2006 | Yamazaki et al. | |
| 7,264,979 B2 | 9/2007 | Yamagata et al. | |
| 7,399,991 B2 | 7/2008 | Seo et al. | |
| 7,459,849 B2 | 12/2008 | Yamazaki et al. | |
| 7,485,478 B2 | 2/2009 | Yamagata et al. | |
| 7,514,868 B2 | 4/2009 | Yamazaki et al. | |
| 7,825,419 B2 | 11/2010 | Yamagata et al. | |
| 8,026,531 B2 | 9/2011 | Seo et al. | |
| 8,044,588 B2 | 10/2011 | Yamazaki et al. | |
| 8,421,352 B2 | 4/2013 | Yamazaki et al. | |
| 8,497,525 B2 | 7/2013 | Yamagata et al. | |
| 8,618,732 B2 | 12/2013 | Yamazaki et al. | |
| 8,679,875 B2 | 3/2014 | Yamagata et al. | |
| 8,772,762 B2 | 7/2014 | Kaneta et al. | |
| 8,866,184 B2 | 10/2014 | Yamagata et al. | |
| 9,142,598 B2 * | 9/2015 | Ohnuma | H01L 51/0085 |
| 9,263,503 B2 | 2/2016 | Yamazaki et al. | |
| 9,502,676 B2 * | 11/2016 | Ohnuma | H01L 51/0085 |
| 2009/0026917 A1 | 1/2009 | Ikeda et al. | |
| 2009/1005828 | 3/2009 | Tanaka et al. | |
| 2010/0090203 A1 | 4/2010 | Obata et al. | |
| 2010/0102335 A1 | 4/2010 | Takagi et al. | |
| 2011/0240971 A1 | 10/2011 | Nowatari et al. | |
| 2012/0007067 A1 | 1/2012 | Kaneta et al. | |
| 2015/0021588 A1 | 1/2015 | Yamagata et al. | |

FOREIGN PATENT DOCUMENTS

| | | |
|---|---|---|
| JP | 2002-164181 A | 6/2002 |
| JP | 2002-324673 A | 11/2002 |
| JP | 2002-334790 A | 11/2002 |
| JP | 2004-200027 A | 7/2004 |
| JP | 3601059 B2 | 12/2004 |
| JP | 2008-223067 A | 9/2008 |
| JP | 2009-064612 A | 3/2009 |
| JP | 2010-225403 A | 10/2010 |
| JP | 2011-014347 A | 1/2011 |
| TW | 426842 B | 3/2001 |
| WO | WO 1999/046748 A1 | 9/1999 |
| WO | WO 2010/109877 A1 | 9/2010 |

* cited by examiner

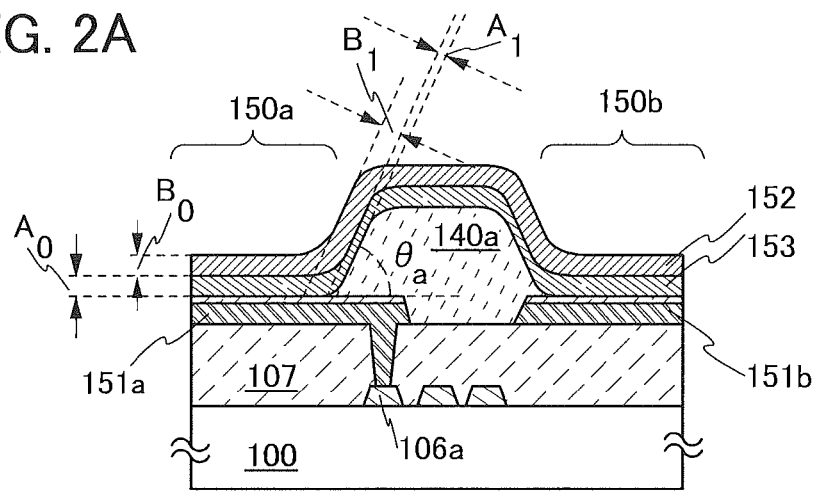
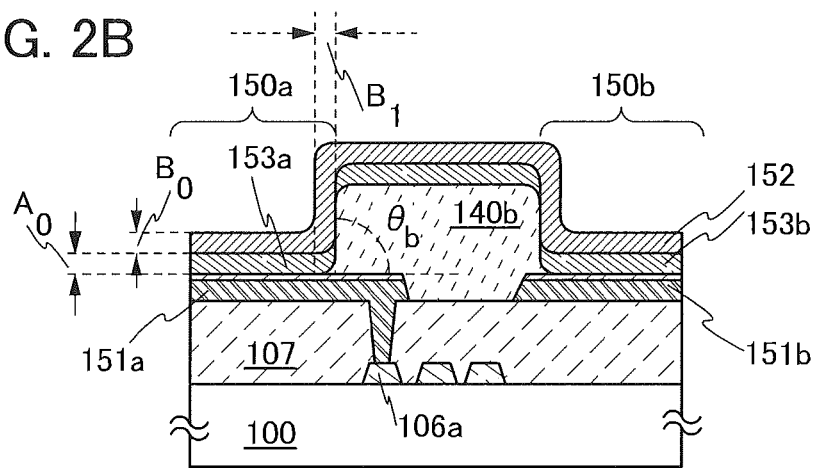
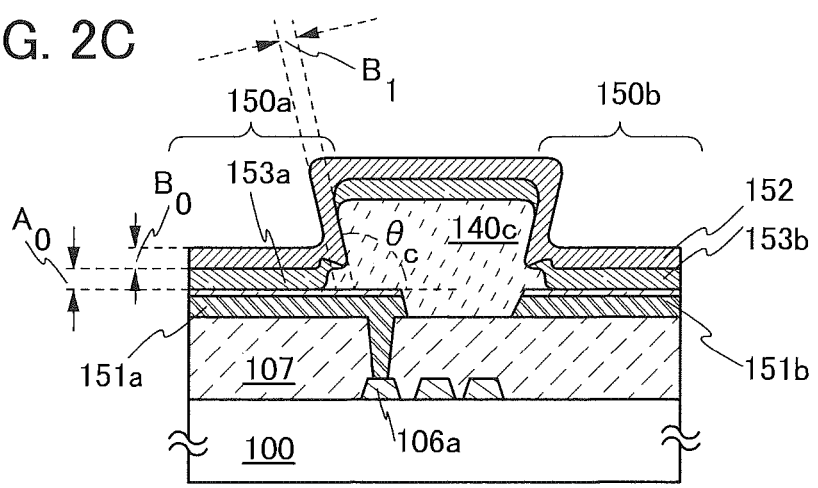

$$\frac{B_1}{B_0} = 58\%$$

$$\frac{A_1}{A_0} = 42\%$$

LIGHT-EMITTING PANEL, LIGHT-EMITTING DEVICE USING THE LIGHT-EMITTING PANEL, AND METHOD FOR MANUFACTURING THE LIGHT-EMITTING PANEL

This application is a continuation of U.S. application Ser. No. 14/858,282, filed on Sep. 18, 2015 which is a continuation of U.S. application Ser. No. 13/527,923, filed on Jun. 20, 2012 (now U.S. Pat. No. 9,142,598 issued Sep. 22, 2015), which are all incorporated herein by reference.

BACKGROUND OF THE INVENTION

1. Field of the Invention

The present invention relates to a light-emitting panel, a light-emitting device including the light-emitting panel, and a method for manufacturing the light-emitting panel.

2. Description of the Related Art

Mobile phones, personal computers, smartphones, e-book readers, and the like have come into widespread use, and the length of time we spend using display devices in our life has thus increased. Since these electronic devices are now in popular use, they are also used for simple work which has conventionally been done with stationery. Specifically, schedule management, address list management, making notes, and the like which have conventionally been done with a notebook are now done with multifunctional electronic devices typified by smartphones.

For most of the electronic devices, a display panel in which display elements are arranged in matrix is used. As the display element, an element which controls transmission of light (e.g., a liquid display element), an element which controls reflection of light (e.g., an element using an electrophoretic method), a light-emitting element which emits light by itself, or the like is used.

A light-emitting element in which a layer containing a light-emitting organic compound (also referred to as an EL layer) which has a film shape is provided between a pair of electrodes is known. Such a light-emitting element is called, for example, an organic EL element, and light emission can be obtained from the layer containing a light-emitting organic compound when voltage is applied between a pair of electrodes. Light-emitting devices such as a lighting device and a display device including an organic EL element are known. Patent Document 1 discloses an example of a light-emitting device including an organic EL element.

REFERENCE

[Patent Document 1] Japanese Published Patent Application No. 2002-324673

SUMMARY OF THE INVENTION

In this specification, one in which light-emitting elements are provided to be adjacent to each other is referred to as a light-emitting panel. In particular, a light-emitting panel in which light-emitting elements each including a layer containing a light-emitting organic compound between a pair of electrodes are provided to be adjacent to each other is referred to as an EL panel. An EL panel is expected to be applied to a lighting device in addition to a display device.

It is difficult to manufacture a multicolor EL panel in which light-emitting elements which emit light of different colors are arranged with high density. For example, a method for forming light-emitting elements which emit light of different colors in matrix using a shadow mask (metal mask) is known; however, it is unsuitable for manufacturing a high-definition EL panel.

As another method, a method for arranging, with high density, light-emitting modules each provided with a color filter overlapping with a light-emitting element which emits white light is known. For example, a plurality of first electrodes are formed in matrix with high density by a photolithography method, a layer emitting white light is provided between the first electrodes and a second electrode overlapping with the first electrodes, and high definition light-emitting elements which emit white light are arranged in matrix. Next, there is a method for manufacturing a light-emitting panel in which color filters exhibiting transmission of different emission colors such as red, green, and blue, are provided adjacent to each other in each of the light-emitting elements, and a plurality of light-emitting modules which emit light of different colors are provided.

However, in a light-emitting panel provided with adjacent light-emitting elements in each of which a layer containing a light-emitting organic compound is sandwiched between a first electrode and a second electrode, a phenomenon in which electric power applied to one light-emitting element is distributed to an adjacent light-emitting element and the adjacent light-emitting element emits light unintentionally (so-called crosstalk) occurs in some cases. A display device to which a light-emitting panel in which such crosstalk occurs is applied cannot display a high definition image. In addition, in a multicolor light-emitting panel, light of a desired color cannot be obtained.

Note that a structure in which an insulating partition having an inversed tapered cross-sectional shape is provided between a plurality of adjacent light-emitting elements to separate a layer containing a light-emitting organic compound and each of a first electrode and a second electrode is employed for, for example, a passive matrix light-emitting panel. In two pixels between which the partition is provided, the occurrence of crosstalk can be prevented. However, when the partition having an inversed tapered cross-sectional shape is provided to surround the light-emitting element, a second electrode is electrically insulated from an adjacent second electrode and thus cannot be supplied with electric power. That is why arrangement of the partition having an inversed tapered cross-sectional shape is limited to arrangement in which second electrodes of adjacent light-emitting elements are continuously provided at least in one direction. As a result, crosstalk occurs in a pixel direction in which second electrodes are continuously provided in some cases.

One embodiment of the present invention is made in view of the foregoing technical background. Therefore, it is an object of one embodiment of the present invention to provide a light-emitting panel in which the occurrence of crosstalk is suppressed. It is another object of one embodiment of the present invention to provide a method for manufacturing a light-emitting panel in which the occurrence of crosstalk is suppressed.

In order to achieve any of the above objects, one embodiment of the present invention focuses on a structure of a light-emitting panel in which light-emitting elements in each of which a layer containing a light-emitting organic compound is sandwiched between a first electrode and a second electrode are provided to be adjacent to each other, and in which the layer containing a light-emitting organic compound is sandwiched between the second electrode and an insulating partition which separates a first electrode of one light-emitting element and a first electrode of the other light-emitting element. Further, one embodiment of the present invention focuses on current flowing between the first electrode of the one light-emitting element and a portion of the second electrode comprised in the other light-emitting element through the layer containing a light-emitting organic compound.

Any of the objects is solved according to one embodiment of the present invention which is a structure in which the layer containing a light-emitting organic compound includes a portion with a thickness $A_1$ smaller than a thickness $A_0$ of a portion in contact with the first electrode, in a portion overlapping with a side surface of the insulating partition, and the ratio ($B_1/B_0$) of a thickness $B_1$ of a portion of the second electrode which overlaps with the side surface of the partition, to a thickness $B_0$ of a portion of the second electrode, which overlaps with the first electrode, is higher than the ratio ($A_1/A_0$). Preferably, the thickness $A_1$ is smaller than ½ of the thickness $A_0$ of the portion in contact with the first electrode.

In other words, one embodiment of the present invention is a light-emitting panel in which one light-emitting element and the other light-emitting element are provided to be adjacent to each other over a substrate. The light-emitting panel includes a first electrode of the one light-emitting element, a first electrode of the other light-emitting element, a partition separating the two first electrodes, a second electrode overlapping with the two first electrodes and the partition, and a layer containing a light-emitting organic compound which is in contact with the two first electrodes and the partition and which is sandwiched between the second electrodes. Further, in the light-emitting panel, the layer containing a light-emitting organic compound includes a portion with a thickness $A_1$ smaller than ½ of a thickness $A_0$ of a portion overlapping with the first electrode, in the portion overlapping with a side surface of the partition, and the ratio ($B_1/B_0$) of a thickness $B_1$ of a portion of the second electrode which overlaps with the side surface of the partition to a thickness $B_0$ of a portion of the second electrode, which overlaps with the first electrode is higher than the ratio ($A_1/A_0$).

The above light-emitting panel according to one embodiment of the present invention includes the first electrode of the one light-emitting element, the first electrode of the other light-emitting element, and the insulating partition which separates the two first electrodes. In the light-emitting panel, the layer containing a light-emitting organic compound includes a portion with a thickness $A_1$ smaller than ½ of a thickness $A_0$ of a portion overlapping with the first electrode, in the portion overlapping with a side surface of the partition, and the ratio ($B_1/B_0$) of the thickness $B_1$ of the portion of the second electrode, which overlaps with the side surface of the partition, to the thickness $B_0$ of the portion of the second electrode, which overlaps with the first electrode, is higher than the ratio ($A_1/A_0$). Note that in this specification, a thickness of a portion of a layer, which overlaps with a side surface of a partition, means a thickness of the portion of the layer in the vertical direction with respect to the side surface of the partition.

Thus, the thickness of the layer containing a light-emitting organic compound which overlaps with the partition provided between the one light-emitting element and the other light-emitting element is reduced, which can lead to an increase in electrical resistance. Therefore, current flowing through the layer containing a light-emitting organic compound provided between the one light-emitting element and the other light-emitting element can be suppressed. In particular, when the thickness of the portion of the layer containing a light-emitting organic compound, which overlaps with a side surface of the partition, is smaller than ½ of the thickness of the portion of the layer containing a light-emitting organic compound, which is in contact with the first electrode, the effect of suppressing current is enhanced; thus, a light-emitting panel in which the occurrence of crosstalk is suppressed can be provided.

According to one embodiment of the present invention, in the above light-emitting panel, a side surface of the insulating partition has an angle of greater than or equal to 55° and less than or equal to 1000 with respect to the substrate.

In the above light-emitting panel according to one embodiment of the present invention, the thickness of the portion of the layer containing a light-emitting organic compound, which overlaps with a side surface of the partition, can be smaller than ½ of the thickness $A_0$ of the portion of the layer containing a light-emitting organic compound, which is in contact with the first electrode. Thus, a region with suppressed conductivity is formed in the portion of the layer containing a light-emitting organic compound, which overlaps with the side surface of the partition, whereby current flowing through the layer containing a light-emitting organic compound provided between the one light-emitting element and the other light-emitting element can be suppressed. As a result, a light-emitting panel in which the occurrence of crosstalk is suppressed can be provided.

One embodiment of the present invention is a light-emitting panel in which a thickness of a portion of a second electrode which overlaps with a side surface of a partition, is larger than a thickness of a portion of the second electrode, which overlaps with the first electrode.

In the above light-emitting panel according to one embodiment of the present invention, the thickness of the portion of the second electrode, which overlaps with the partition, is large. Thus, a region with increased conductivity is formed in the portion of the second electrode, which overlaps with the partition, and an effect of increasing the conductivity of the planar second electrode, an effect of a so-called auxiliary wiring, can be obtained. As a result, a light-emitting panel can be provided in which the occurrence of a phenomenon where current flows unevenly is prevented by suppression of a decrease in voltage due to electrical resistance of the second electrode, so that light can be emitted uniformly.

According to one embodiment of the present invention, the above light-emitting panel includes a layer containing a light-emitting organic compound including a charge generation region containing a substance having a high hole-transport property and an acceptor substance with respect to the substance having a high hole-transport property, and a light-emitting unit. The charge generation region is provided between the light-emitting unit and the first electrode.

The above light-emitting panel according to one embodiment of the present invention is provided with the charge generation region containing a substance having a high hole-transport property and an acceptor substance with respect to the substance having a high hole-transport property. In addition, the thickness of a portion of the charge generation region, which overlaps with a side surface of the partition, is small.

Thus, the conductivity is suppressed, whereby current flowing between the first electrode of the one light-emitting element and the light-emitting unit of the other light-emitting element through the charge generation region can be suppressed. As a result, a light-emitting panel in which the occurrence of crosstalk is suppressed can be provided.

According to one embodiment of the present invention, the above light-emitting panel includes a layer containing a light-emitting organic compound including an electron-injection buffer containing a substance having a high electron-transport property and a donor substance with respect to the substance having a high electron-transport property, and a light-emitting unit. The electron-injection buffer is provided between the light-emitting unit and the first electrode.

The above light-emitting panel according to one embodiment of the present invention includes the electron-injection buffer containing a substance having a high electron-transport property and a donor substance with respect to the substance having a high electron-transport property. The thickness of a portion of the electron-injection buffer, which overlaps with a side surface of the partition, is small. Thus, the conductivity is suppressed, whereby current flowing between the first electrode of the one light-emitting element and the light-emitting unit of the other light-emitting element through the electron-injection buffer can be suppressed. As a result, a light-emitting panel in which the occurrence of crosstalk is suppressed can be provided.

According to one embodiment of the present invention, the above light-emitting panel includes a layer containing a light-emitting organic compound provided with a plurality of light-emitting units and intermediate layers sandwiched between the light-emitting units. Each of the intermediate layers includes an electron-injection buffer containing a substance having a high electron-transport property and a donor substance with respect to the substance having a high electron-transport property.

The above light-emitting panel according to one embodiment of the present invention includes the intermediate layers sandwiched between the light-emitting units, and the intermediate layers are each provided with an electron-injection buffer containing a substance having a high electron-transport property and a donor substance with respect to the substance having a high electron-transport property. Thus, the thickness of the portion of the electron-injection buffer provided in one intermediate layer, which overlaps with a side surface of the partition, is small and the conductivity is suppressed, whereby current flowing between the first electrode of the one light-emitting element and the light-emitting unit of the other light-emitting element through the electron-injection buffer provided in the intermediate layer can be suppressed. As a result, a light-emitting panel in which the occurrence of crosstalk is suppressed can be provided.

One embodiment of the present invention is a light-emitting device including the above-described light-emitting panel.

The above light-emitting device according to one embodiment of the present invention includes a first electrode of one light-emitting element, a first electrode of the other light-emitting element, a partition which separates the two first electrodes, and a layer containing a light-emitting organic compound which is in contact with the two first electrodes and the partition and which is sandwiched between the two first electrodes and a second electrode. In addition, a light-emitting panel is provided in which a thickness $A_1$ of a portion of a layer containing a light-emitting organic compound, which overlaps with a side surface of the partition, is smaller than ½ of a thickness $A_0$ of a portion of the layer containing a light-emitting organic compound, which is in contact with the first electrode, the ratio $(B_1/B_0)$ of a thickness $B_1$ of a portion of the second electrode, which overlaps with a side surface of the partition, to a thickness $B_0$ of a portion of the second electrode, which overlaps with the first electrode, is higher than the ratio $(A_1/A_0)$, and crosstalk is suppressed. As a result, a light-emitting device can be provided in which the occurrence of crosstalk is suppressed.

One embodiment of the present invention is a method for manufacturing a light-emitting panel including a first step of forming two first electrodes which are adjacent to each other over a substrate and an insulating partition which separates the two first electrodes and whose a side surface forms an angle of greater than or equal to 55° and less than or equal to 100° with respect to the substrate, a second step of forming a layer containing a light-emitting organic compound so that a portion with a thickness $A_1$ smaller than ½ of a thickness $A_0$ of a portion which overlaps with the first electrode is provided in a portion overlapping with a side surface of the partition by a deposition method having directivity in a vertical direction to the substrate, and a third step of forming a second electrode by a deposition method by which a layer is deposited on the the side surface of the partition so that the ratio $(B_1/B_0)$ of a thickness $B_1$ of a portion of the second electrode which overlaps with the side surface of the partition, to a thickness $B_0$ of a portion of the second electrode which overlaps with the first electrode, is higher than the ratio $(A_1/A_0)$.

According to the above method for manufacturing a light-emitting panel according to one embodiment of the present invention, the two first electrodes and the insulating partition which separates the two first electrodes can be formed. The portion with the thickness $A_1$ smaller than ½ of the thickness $A_0$ of the portion, which overlaps with the first electrode, can be formed in the portion of the layer containing a light-emitting organic compound, which overlaps with a side surface of the partition. The ratio $(B_1/B_0)$ of the thickness $B_1$ of the portion of the second electrode which overlaps with the side surface of the partition, to the thickness $B_0$ of the portion of the second electrode which overlaps with the first electrode, can be higher than the ratio $(A_1/A_0)$.

Thus, the thickness of the layer containing a light-emitting organic compound which overlaps with the partition provided between the one light-emitting element and the other light-emitting element is decreased, which can lead to suppression of current flowing through the layer containing a light-emitting organic compound provided between the one light-emitting element and the other light-emitting element. As a result, a method for manufacturing a light-emitting panel in which the occurrence of crosstalk is suppressed can be provided.

Note that in this specification, an "EL layer" refers to a layer provided between a pair of electrodes in a light-emitting element. Thus, a light-emitting layer containing an organic compound that is a light-emitting substance which is interposed between electrodes is an embodiment of the EL layer.

In this specification, in a layer containing a light-emitting organic compound provided between a pair of electrodes, a layer or a stack body including one region where electrons and holes are recombined is referred to as a light-emitting unit.

In this specification, a layer which includes at least a charge generation region, injects holes into an adjacent layer on the cathode side, and injects electrons into an adjacent layer on the anode side is referred to as an intermediate layer. For example, in the case where a layer containing a light-emitting organic compound includes a plurality of light-emitting units, an intermediate layer is provided between light-emitting units.

In this specification, in the case where a substance A is dispersed in matrix formed using a substance B, the substance B forming the matrix is referred to as a host material, and the substance A dispersed in the matrix is referred to as a guest material.

Note that the substance A and the substance B may each be a single substance or a mixture of two or more kinds of substances.

Note that a light-emitting device in this specification means an image display device, a light-emitting device, or a light source (including a lighting device). In addition, the light-emitting device includes any of the following modules in its category: a module in which a connector such as an FPC (flexible printed circuit), a TAB (tape automated bonding) tape, or a TCP (tape carrier package) is attached to a light-emitting device; a module having a TAB tape or a TCP provided with a printed wiring board at the end thereof; and a module having an IC (integrated circuit) directly mounted over a substrate over which a light-emitting element is formed by a COG (chip on glass) method.

According to one embodiment of the present invention, a light-emitting panel in which the occurrence of crosstalk is suppressed can be provided. Alternatively, a method for manufacturing a light-emitting panel in which the occurrence of crosstalk is suppressed can be provided.

BRIEF DESCRIPTION OF THE DRAWINGS

FIGS. 2A to 2C each illustrate a structure of a light-emitting panel according to one embodiment.

DETAILED DESCRIPTION OF THE INVENTION

Figure 1A:
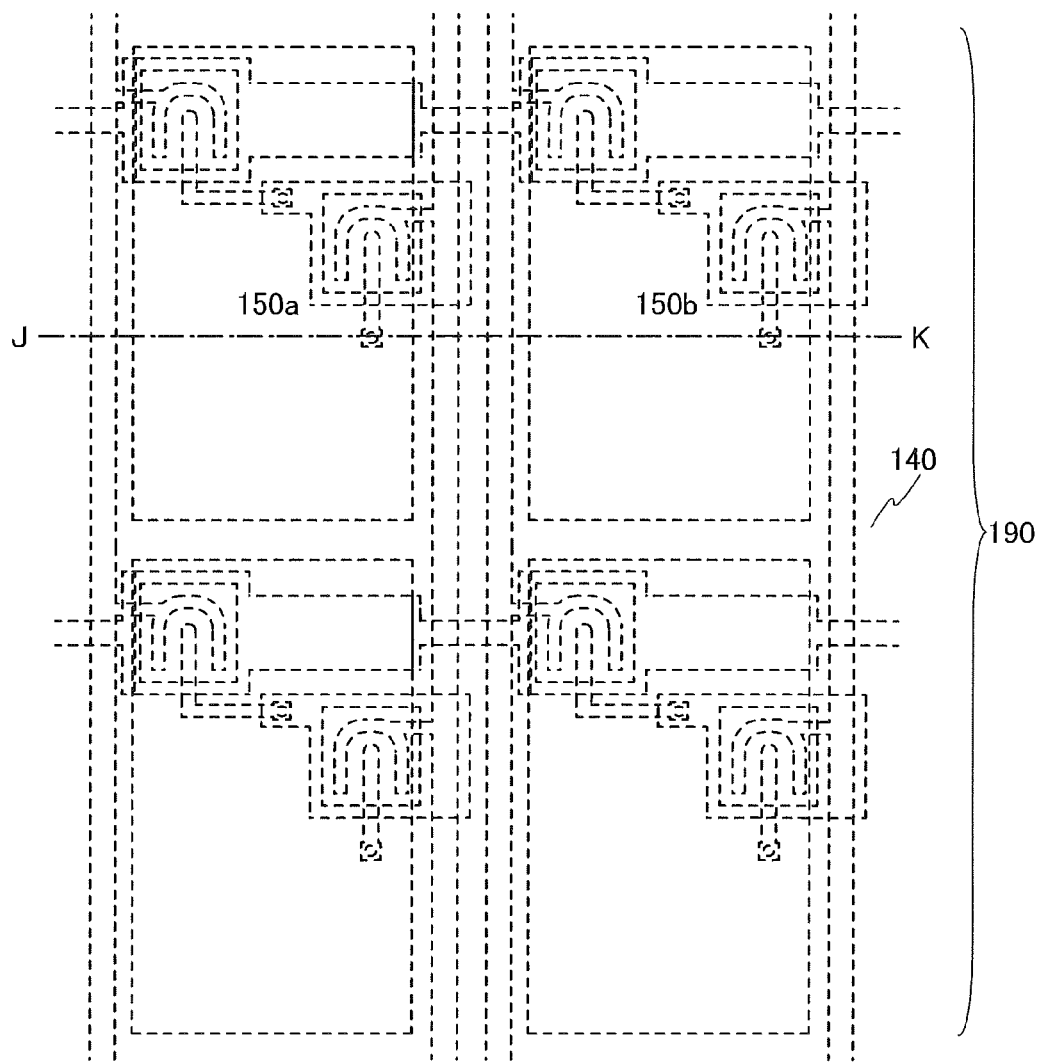
FIGS. 1A and 1B illustrate a structure of a light-emitting panel according to one embodiment.

Embodiments will be described with reference to the drawings. Note that the present invention is not limited to the following description and it will be readily appreciated by those skilled in the art that modes and details can be modified in various ways without departing from the spirit and the scope of the present invention. Therefore, the invention should not be construed as being limited to the description in the following embodiments. Note that in structures of the present invention described hereinafter, the same portions or portions having similar functions are denoted by the same reference numerals in different drawings, and description thereof is not repeated.

(Embodiment 1)

In this embodiment, a light-emitting panel having a structure in which a thickness $A_1$ of a portion of a layer containing a light-emitting organic compound, which overlaps with a side surface of a partition, is smaller than ½ of a thickness $A_0$ of a portion of the layer containing a light-emitting organic compound, which is in contact with a first electrode, and the ratio ($B_1/B_0$) of a thickness $B_1$ of a portion of a second electrode, which overlaps with the side surface of the partition, to a thickness $B_0$ of a portion of the second electrode, which overlaps with the first electrode, is higher than the ratio ($A_1/A_0$) will be described with reference to FIGS. 1A and 1B and FIGS. 2A to 2C. Specifically, an EL panel which can be applied to a display device will be described.

Figure 1B:
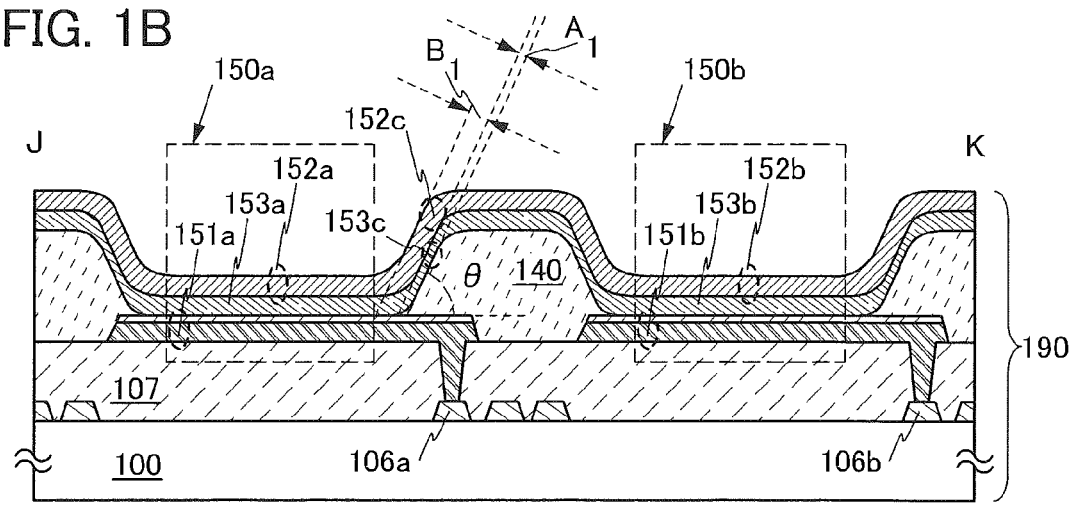

FIGS. 1A and 1B illustrate a structure of an EL panel according to one embodiment of the present invention. FIG. 1A is a top view of an EL panel 190 according to one embodiment of the present invention, and FIG. 1B is a cross-sectional view taken along line J-K in FIG. 1A.

The EL panel 190 in FIG. 1A includes a partition 140 between one light-emitting element 150a and the other light-emitting element 150b. As illustrated in FIG. 1B, the EL panel 190 includes the one light-emitting element 150a and the other light-emitting element 150b over an insulating layer 107 provided over a substrate 100. In addition, the EL panel 190 includes a layer 153 containing a light-emitting organic compound interposed between a second electrode on one side, and a first electrode 151a of the one light-emitting element 150a and a first electrode 151b of the other light-emitting element 150b on the other side.

The one light-emitting element 150a includes a first electrode 151a, a portion 152a of a second electrode, and a portion 153a of a layer containing a light-emitting organic compound, and the other light-emitting element 150b includes a first electrode 151b, a portion 152b of the second electrode, and a portion 153b of the layer containing the light-emitting organic compound.

Each of the first electrodes 151a and 151b is an island-shaped conductive layer formed over the insulating layer 107 and is electrically connected to an electrode 106a or an electrode 106b which is provided between the substrate 100 and the insulating layer 107. Note that a structure of a light-emitting element which can be applied to the one light-emitting element 150a or the other light-emitting element 150b will be described in detail in Embodiment 3.

The partition 140 covers an end portion of the first electrode 151a and an end portion of the first electrode 151b and includes an opening portion overlapping with the first electrode 151a and an opening portion overlapping with the first electrode 151b. The side surface of the partition 140 has an angle θ with respect to the substrate 100. In addition, an end portion of the partition 140 is preferably formed so as to be in contact with the first electrode 151a at an angle smaller than the angle θ to prevent a short circuit between the first electrode 151a and the second electrode 152a at the end portion of the partition 140.

The partition 140 has an insulating property and is formed using an organic insulating material or an inorganic insulating material. In particular, a photosensitive resin material is preferably used because an angle of a side surface of an opening portion formed over the first electrode is easily controlled.

A portion 153c of the layer containing a light-emitting organic compound is formed over a side surface of the partition 140, and a portion 152 of the second electrode is formed over the layer 153c containing a light-emitting organic compound.

The portion 152c of the second electrode formed over the partition 140 electrically connects the portion 152a of second electrode of the one light-emitting element 150a to the portion 152b of the second electrode of the other light-emitting element 150b.

The thickness of the portion 153c of the layer containing a light-emitting organic compound which is formed over the side surface of the partition 140 is smaller than in other portions; therefore, electrical resistance of the layer containing a light-emitting organic compound is higher on the side surface of the partition 140 than in other regions. Since a region with high electrical resistance is formed along the side surface of the partition 140, current flowing between the one light-emitting element and the other light-emitting element through the layer 153c containing a light-emitting organic compound can be suppressed. As a result, a light-emitting panel in which the occurrence of crosstalk is suppressed can be provided.

FIGS. 2A to 2C illustrate modes of partitions whose side surfaces have different angles according to embodiments of the present invention. The partitions whose side surfaces have different angles are described below.

<Mode 1 of Partition>

FIG. 2A illustrates a mode of a partition according to one embodiment of the present invention. A partition 140a illustrated in FIG. 2A covers an end portion of the first electrode 151a of the one light-emitting element 150a and an end portion of the first electrode 151b of the other light-emitting element 150b and includes an opening portion overlapping with the first electrode 151a and an opening portion overlapping with the first electrode 151b. The side surface of the partition 140a forms an angle $\theta_a$ comprised between 55° and 100° with the substrate 100, and $\theta_a$ is approximately 65° in this mode of a partition.

The thickness $A_1$ of a portion of a layer 153 containing a light-emitting organic compound, which overlaps with the side surface of the partition 140a, is smaller than ½ of the thickness $A_0$ of the layer 153 containing a light-emitting organic compound, which is in contact with the first electrode 151a.

The ratio ($B_1/B_0$) of the thickness $B_1$ of a portion of the second electrode 152, which overlaps with the side surface of the partition 140a, to the thickness $B_0$ of a portion of the second electrode 152, which overlaps with the first electrode 151a, is higher than the ratio ($A_1/A_0$), and a portion of the second electrode of the one light-emitting element 150a and a portion of the second electrode of the other light-emitting element 150b are electrically connected to each other through a portion of the second electrode formed over the side surface of the partition 140a.

With the above structure, the thickness of the portion of the layer 153 containing a light-emitting organic compound, which overlaps with the side surface of the partition 140a provided between the one light-emitting element 150a and the other light-emitting element 150b, is reduced, which can lead to an increase in electrical resistance. Therefore, current flowing through the layer 153 containing a light-emitting organic compound provided between the one light-emitting element 150a and the other light-emitting element 150b can be suppressed. As a result, a light-emitting panel in which the occurrence of crosstalk is suppressed can be provided. In addition, the planar second electrode 152 electrically connects the one light-emitting element 150a to the other light-emitting element 150b; therefore, each light-emitting element can be operated by application of voltage to the first electrode.

<Mode 2 of Partition>

FIG. 2B illustrates a mode of a partition according to one embodiment of the present invention. A partition 140b illustrated in FIG. 2B covers an end portion of the first electrode 151a of the one light-emitting element 150a and an end portion of the first electrode 151b of the other light-emitting element 150b and includes an opening portion overlapping with the first electrode 151a and an opening portion overlapping with the first electrode 151b. A side surface of the partition 140b forms an angle $\theta_b$ comprised between 55° and 100° with the substrate 100, and $\theta_b$ is approximately 90° in this mode of a partition.

Since a layer containing a light-emitting organic compound is not formed on the side surface of the partition 140b, the layer 153a containing a light-emitting organic compound of the one light-emitting element 150a and the layer 153b containing a light-emitting organic compound of the other light-emitting element 150b are separated from each other by the partition 140b.

Further, the second electrode 152 is formed in a portion which overlaps with the side surface of the partition 140b, and a portion of the second electrode of the one light-emitting element 150a and a portion of the second electrode of the other light-emitting element 150b are electrically connected to each other through a portion of the second electrode formed over the side surface of the partition 140b.

Thus, current flowing between the one light-emitting element 150a and the other light-emitting element 150b can be suppressed. As a result, a light-emitting panel in which the occurrence of crosstalk is suppressed can be provided. In addition, the planar second electrode 152 electrically connects the one light-emitting element 150a to the other light-emitting element 150b; therefore, each light-emitting element can be operated by application of voltage to the first electrode.

<Mode 3 of Partition>

FIG. 2C illustrates a mode of a partition according to one embodiment of the present invention. A partition 140c illustrated in FIG. 2C covers an end portion of the first electrode 151a of the one light-emitting element 150a and an end portion of the first electrode 151b of the other light-emitting element 150b and includes an opening portion overlapping with the first electrode 151a and an opening portion overlapping with the first electrode 151b. A side surface of the partition 140c forms an angle $\theta_c$ comprised between 55° and 100° with the substrate 100, and $\theta_c$ is approximately 100° in this mode of a partition. Note that as illustrated in FIG. 2C, a portion narrower than the widths of an top portion and a bottom portion of the partition 140c is provided between the top portion and the bottom portion of the partition 140c, so that a short circuit between the first electrode and the second electrode can be prevented.

Since a layer containing a light-emitting organic compound is not formed on the side surface of the partition 140c, the layer 153a containing a light-emitting organic compound of the one light-emitting element 150a and the layer 153b containing a light-emitting organic compound of the other light-emitting element 150b are apart from each other by the partition 140c.

Further, the second electrode 152 is formed in a portion which overlaps with the side surface of the partition 140c, and a portion of the second electrode of the one light-emitting element 150a and a portion of the second electrode of the other light-emitting element 150b are electrically connected to each other through a portion of the second electrode formed over the side surface of the partition 140c.

Thus, current flowing between the one light-emitting element 150a and the other light-emitting element 150b can be suppressed. As a result, a light-emitting panel in which the occurrence of crosstalk is suppressed can be provided. In addition, the planar second electrode 152 electrically connects the one light-emitting element 150a to the other light-emitting element 150b; therefore, each light-emitting element can be operated by application of voltage to the first electrode.

The above light-emitting panel according to one embodiment of the present invention includes the first electrode of the one light-emitting element, the first electrode of the other light-emitting element, and an insulating partition which separates the two first electrodes. The thickness $A_1$ of the portion of the layer containing a light-emitting organic compound which overlaps with the side surface of the partition, is smaller than ½ of the thickness $A_0$ of the portion of the layer containing a light-emitting organic compound which is in contact with the first electrode, and the ratio $(B_1/B_0)$ of the thickness $B_1$ of the portion of the second electrode, which overlaps with the side surface of the partition, to the thickness $B_0$ of the portion of the second electrode, which overlaps with the first electrode, is higher than the ratio $(A_1/A_0)$.

Thus, the thickness of the portion of the layer containing a light-emitting organic compound, which overlaps with the side surface of the partition provided between the one light-emitting element and the other light-emitting element, is reduced, which can lead to an increase in electrical resistance. Therefore, current flowing through the layer containing a light-emitting organic compound provided between the one light-emitting element and the other light-emitting element can be suppressed. In particular, when the thickness of the portion of the layer containing a light-emitting organic compound, which overlaps with the side surface of the partition, is smaller than ½ of the thickness of the portion of the layer containing a light-emitting organic compound, which is in contact with the first electrode, the effect of suppressing current is enhanced; thus, a light-emitting panel in which the occurrence of crosstalk is suppressed can be provided.

Note that a light-emitting panel in which light-emitting elements are provided at short intervals has a high aperture ratio and driving voltage can be reduced as compared to a light-emitting panel with a low aperture ratio; therefore, power consumption can be reduced. When the light-emitting panel in which the light-emitting elements are provided at short intervals is used for a display device, an image with high definition can be displayed. However, when the distance between one light-emitting element and the other light-emitting element is short, crosstalk easily occurs. In other words, as a light-emitting panel has a higher aperture ratio or higher definition, crosstalk occurs easily. Specifically, in the case where distance between adjacent light-emitting elements is less than or equal to 7 μm, crosstalk easily occurs. In the case of greater than or equal to 350 pixels per inch (i.e., the horizontal resolution is greater than or equal to 350 pixels per inch (ppi)), crosstalk easily occurs; in particular, in the case of greater than or equal to 400 ppi, crosstalk frequently occurs.

A light-emitting panel according to one embodiment of the present invention can suppress the occurrence of crosstalk even in the case of a light-emitting panel with a high aperture ratio or high definition. This embodiment can be combined with any of the other embodiments in this specification as appropriate.

(Embodiment 2)

Figure 3A:
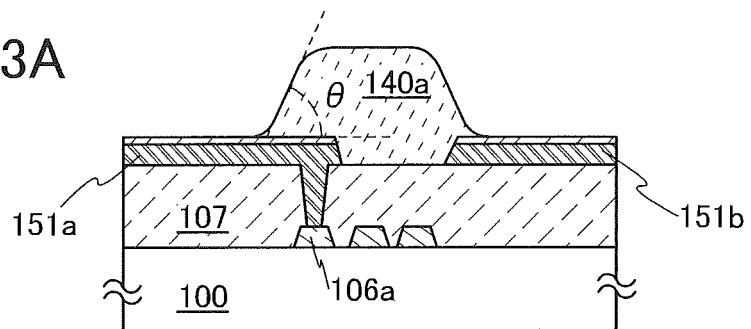
FIGS. 3A to 3C illustrate a method for manufacturing a light-emitting panel according to one embodiment.
Figure 3B:
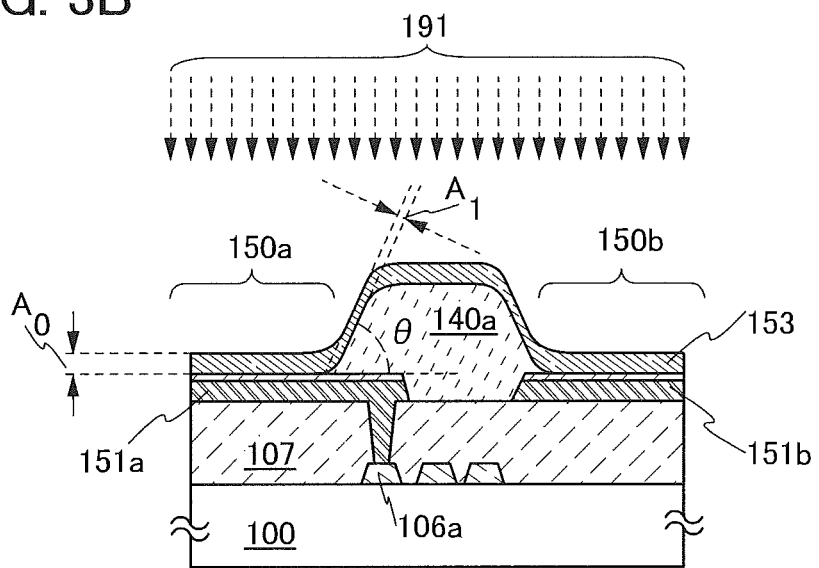
Figure 3C:
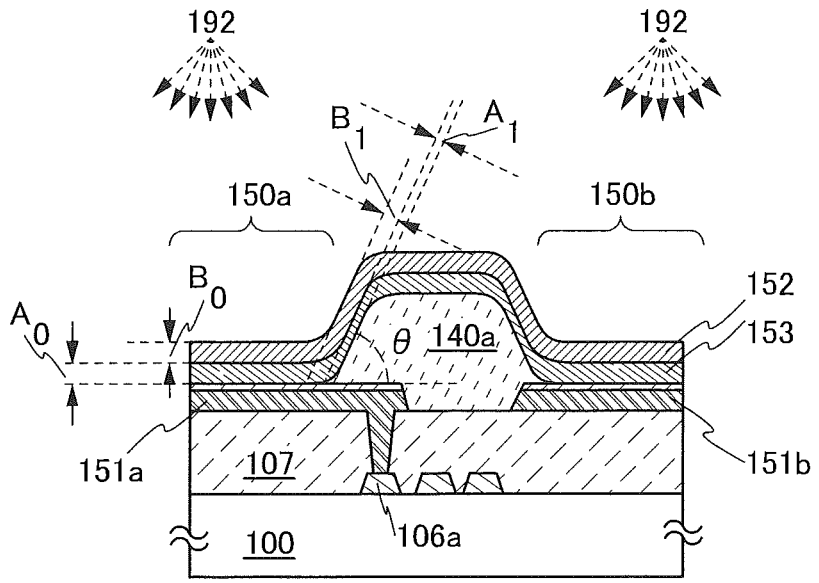

In this embodiment, a method for manufacturing a light-emitting panel having a structure in which the thickness $A_1$ of a portion of a layer containing a light-emitting organic compound which overlaps with a side surface of a partition, is smaller than ½ of the thickness $A_0$ of a portion of the layer containing a light-emitting organic compound, which is in contact with a first electrode, and the ratio $(B_1/B_0)$ of the thickness $B_1$ of a portion of a second electrode, which overlaps with the side surface of the partition, to the thickness $B_0$ of a portion of the second electrode, which overlaps with the first electrode, is higher than the ratio $(A_1/A_0)$ will be described with reference to FIGS. 3A to 3C.

<First Step>

A wiring layer including the electrode 106a is formed over an insulating surface of the substrate 100, and the insulating layer 107 is formed over the wiring layer including the electrode 106a. Next, an opening portion which reaches the electrode 106a is formed in the insulating layer 107, and a conductive film serving as a first electrode is formed so as to be electrically connected to the electrode 106a. Then, the conductive film is processed into island shapes, so that the first electrode 151a and the first electrode 151b are formed.

Next, the insulating partition 140a is formed. The partition 140a covers an end portion of the first electrode 151a and an end portion of the first electrode 151b and is formed to include an opening portion overlapping with the first electrode 151a and an opening portion overlapping with the first electrode 151b. The partition 140a is formed so that a side surface thereof has an angle θ of 55° to 100° with respect to the substrate 100.

The angle θ of the side surface of the partition 140a is adjusted, for example, by using a positive photoresist and adjusting as appropriate light exposure conditions of the positive photoresist. In this way, the angle θ of the side surface is adjusted in the range of 55° to 90°, and a partition can be formed.

Alternatively, a negative photoresist can be used and a mask gap is adjusted as appropriate, so that a partition can be formed by adjusting the angle θ of the side surface in the range of 90° to 100°.

Note that the method for adjusting the angle θ of the side surface of the insulating partition 140a is not limited thereto; a known method, e.g., an etching method or an ashing method, or a combination of known methods can be employed (see FIG. 3A).

<Second Step>

Next, the layer 153 containing a light-emitting organic compound is formed in contact with the first electrode 151a of the one light-emitting element 150a, the first electrode 151b of the other light-emitting element 150b, and an upper portion of the insulating partition 140a. Here, the layer 153 containing a light-emitting organic compound is formed by a deposition method 191 having directivity in a direction vertical to the two first electrodes. By the deposition method 191 having directivity in the direction vertical to the first electrodes, the layer can be preferentially formed over surfaces of the first electrodes compared to side surfaces of the partition.

As a deposition method having directivity in a direction vertical to a first electrode, a deposition method in which the speed of deposition of a layer over a plane vertical to a surface of the first electrode is lower than or equal to 1/10 of the speed of deposition of a layer over a surface of the first electrode is preferable. As an example of the deposition method 191 having directivity in the direction vertical to the first electrodes, a resistance heating method can be given.

Note that the side surface of the insulating partition 140a has an angle θ of greater than or equal to 55° and less than or equal to 100° with respect to the substrate 100; therefore, when the layer 153 containing a light-emitting organic compound is formed by the deposition method 191 having directivity in the direction vertical to the first electrodes 151a, the thickness $A_1$ of the portion of the layer 153 containing a light-emitting organic compound, which overlaps with the side surface of the partition 140a, is smaller than ½ of the thickness $A_0$ of the portion of the layer 153 containing a light-emitting organic compound, which is in contact with the first electrode 151a (see FIG. 3B).

Thus, the thickness of the portion of the layer 153 containing a light-emitting organic compound, which overlaps with the side surface of the partition 140a provided between the one light-emitting element 150a and the other light-emitting element 150b, is reduced, which can lead to an increase in electrical resistance; therefore, current flowing through the layer 153 containing a light-emitting organic compound provided between the one light-emitting element 150a and the other light-emitting element 150b can be suppressed. Thus, a light-emitting panel in which the occurrence of crosstalk is suppressed can be provided.

<Third Step>

Next, the second electrode 152 is formed. The second electrode 152 is formed so as to overlap with the first electrode 151a, the first electrode 151b, and the insulating partition 140a and to be in contact with the layer 153 containing a light-emitting organic compound. Note that the second electrode 152 is formed by a deposition method 192 by which a layer is deposited not only over the layer 153 containing a light-emitting organic compound and but is also deposited at high enough speed over the side surface of the insulating partition 140a. By the deposition method 192 by which a layer is deposited also over the side surface of the insulating partition 140a, the second electrode 152 is formed also over the side surface of the partition 140a, and the second electrode of the one light-emitting element 150a and the second electrode of the other light-emitting element 150b can be electrically connected to each other.

As the deposition method 192 by which a layer is deposited also over the side surface of the insulating partition 140a, a deposition method in which the speed of deposition of a layer over a plane vertical to the substrate over which the first electrode is formed is higher than or equal to ½ and lower than or equal to 1 of the speed of deposition of a layer over a surface parallel to the substrate is preferable. When the ratio of the deposition speed is smaller than ½, it is difficult to increase the thickness of the portion of the second electrode that overlaps with the side surface of the partition. When the ratio of the deposition speed is larger than 1, the deposition speed of the portion of the second electrode that overlaps with the first electrodes, becomes low. As an example of the deposition method 192 by which a layer is deposited also over the side surface of the partition 140a, a sputtering method can be given (see FIG. 3C).

Note that when the second electrode 152 is formed by the deposition method 192 by which a layer is deposited also over the side surface of the insulating partition 140a, the ratio ($B_1/B_0$) of the thickness $B_1$ of the portion of the second electrode, which overlaps with the side surface of the partition 140a, to the thickness $B_0$ of the portion of the second electrode, which overlaps with the first electrode, can be higher than the ratio ($A_1/A_0$). Thus, the second electrode of the one light-emitting element 150a and the second electrode of the other light-emitting element 150b are electrically connected to each other while electrical resistance is increased by a reduction in the thickness of the portion of the layer 153 containing a light-emitting organic compound, which overlaps with the side surface of the partition 140a.

<Alternative Example of Method for Manufacturing Light-Emitting Panel>

Next, an alternative example of a method for manufacturing a light-emitting panel according to one embodiment of the present invention will be described with reference to FIGS. 4A to 4C.

Through the above first step, the insulating partition 140a is formed so that the side surface thereof has an angle θ of greater than or equal to 55° and less than or equal to 100° with respect to the substrate 100.

Next, through the above second step, the layer 153 containing a light-emitting organic compound is formed. Thus, the thickness of the portion of the layer 153 containing a light-emitting organic compound, which overlaps with the side surface of the partition 140a provided between the one light-emitting element 150a and the other light-emitting element 150b, can be reduced and electrical resistance can be increased, whereby current flowing through the layer 153 containing a light-emitting organic compound provided between the one light-emitting element 150a and the other light-emitting element 150b can be suppressed. As a result, a light-emitting panel in which the occurrence of crosstalk is suppressed can be provided.

In this modification example, the second electrode 152 is deposited by a deposition method 193 having directivity in a direction vertical to the side surface of the insulating partition 140a in the third step.

Figure 4A:
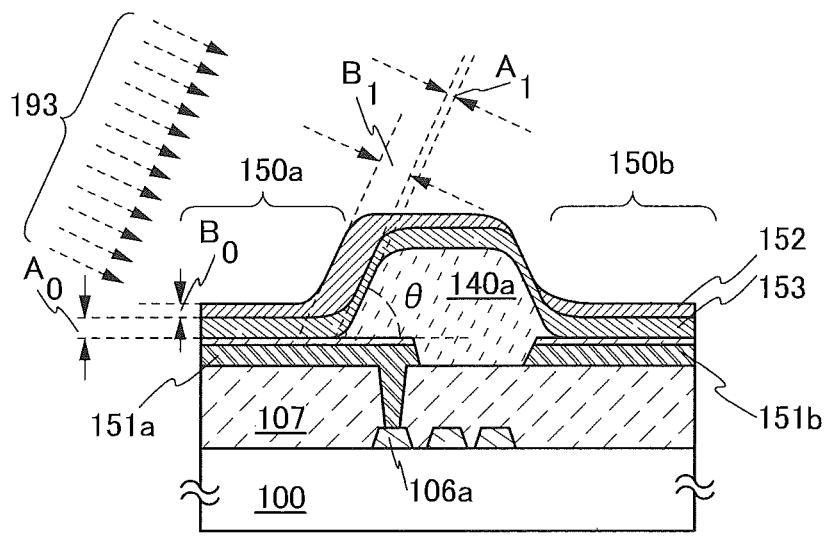
FIGS. 4A to 4C illustrate a method for manufacturing a light-emitting panel according to one embodiment.
Figure 4B:
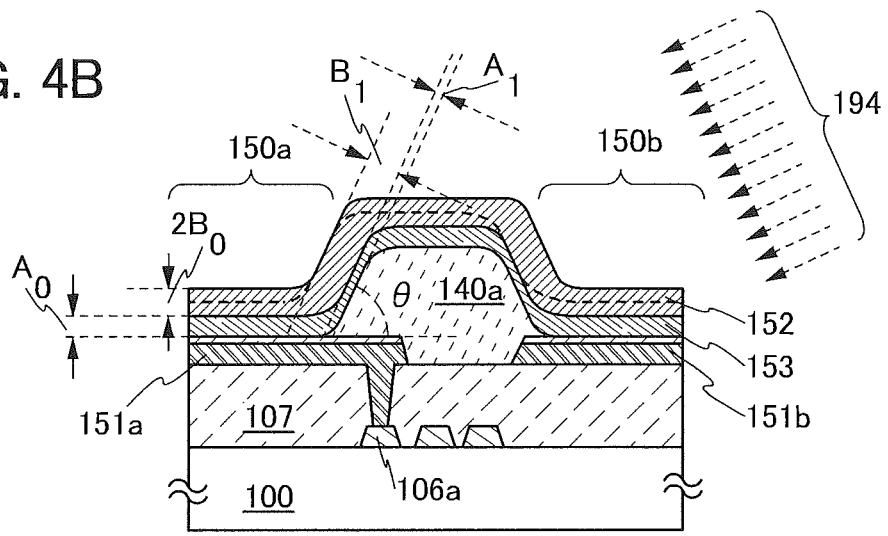
Figure 4C:
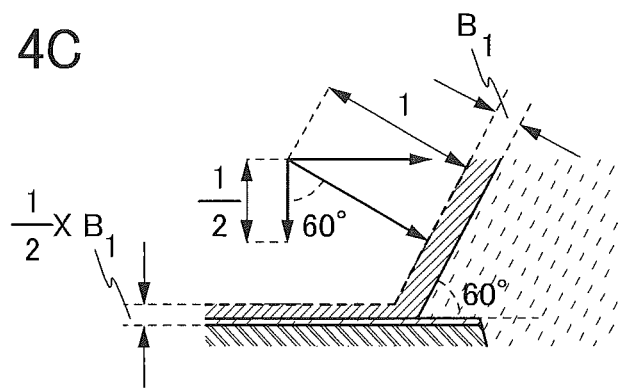

For example, when the second electrode with the thickness $B_1$ is deposited over one of the side surfaces of the partition which has an angle θ of 60° with respect to the substrate, the thickness $B_0$ of the second electrode over the first electrode is $B_1 \times \cos 60°$, i.e., about ½ of $B_1$ (see FIG. 4C). As described above, when a layer is deposited over the side surface of the partition by the deposition method having directivity, preferential deposition of the layer over the side surface of the partition can be performed.

In this alternative example, deposition is performed on one (the left side) of the side surfaces of the partition 140a by the deposition method 193 having directivity (see FIG. 4A). Subsequently, deposition is performed on the other (the right side) of the side surfaces of the partition 140a by a deposition method 194 having directivity (see FIG. 4B). Note that a dotted line in the second electrode 152 indicates a portion formed by the deposition method 193. By this method, the second electrode 152 can be deposited over both of the side surfaces of the partition 140a in preference to deposition over the first electrode.

When deposition is performed on both of the side surfaces of the partition in a condition that the side surface has an angle θ of 60° with respect to the substrate, the thickness $B_0$ of the second electrode 152 over the first electrode 151a or the first electrode 151b is substantially the same as the thickness $B_1$ of a portion of the second electrode 152, which overlaps with the side surface.

Then, the insulating partition 140a is formed so that the side surface has an angle θ of greater than 60° and less than approximately 90° with respect to the substrate 100 and deposition is performed by a deposition method having directivity in the direction vertical to the side surface, so that the portion of the second electrode, which overlaps with the side surface of the partition 140a, can be thicker than the portion of the second electrode, which overlaps with the first electrode.

In the light-emitting panel according to one embodiment of the present invention, the thickness of the portion of the second electrode, which overlaps with the side surface of the partition, is large. Thus, a region with increased conductivity is formed in the portion of the second electrode, which overlaps with the side surface of the partition, and an effect of increasing the conductivity of the planar second electrode, an effect of a so-called auxiliary wiring, can be obtained. As a result, a light-emitting panel can be provided in which the occurrence of a phenomenon where current flows unevenly is prevented by suppression of a decrease in voltage due to electrical resistance of the second electrode, so that light can be emitted uniformly.

By the above method for manufacturing a light-emitting panel, which is one embodiment of the present invention, the first electrode of the one light-emitting element, the first electrode of the other light-emitting element, and the insulating partition which separates the two first electrodes can be formed. The thickness $A_1$ of the portion of the layer containing a light-emitting organic compound, which overlaps with a side surface of the partition, can be smaller than ½ of the thickness $A_0$ of the layer containing a light-emitting organic compound, which is in contact with the first electrode. Further, the ratio ($B_1/B_0$) of the thickness $B_1$ of the portion of the second electrode, which overlaps with the side surface of the partition, to the thickness $B_0$ of the portion of the second electrode, which overlaps with the first electrode, can be higher than the ratio ($A_1/A_0$).

Thus, the thickness of the portion of the layer containing a light-emitting organic compound, which overlaps with the side surface of the partition provided between the one light-emitting element and the other light-emitting element, is reduced, which can lead to an increase in electrical resistance. Therefore, current flowing through the layer containing a light-emitting organic compound provided between the one light-emitting element and the other light-emitting element can be suppressed. In particular, when the thickness of the portion of the layer containing a light-emitting organic compound, which overlaps with the side surface of the partition, is smaller than ½ of the thickness of the portion of the layer containing a light-emitting organic compound, which is in contact with the first electrode, the effect of suppressing current is enhanced; thus, a light-emitting panel in which the occurrence of crosstalk is suppressed can be provided.

This embodiment can be combined with any of the other embodiments in this specification as appropriate.

(Embodiment 3)

For a light-emitting panel according to one embodiment of the present invention, layers containing light-emitting organic compounds with a variety of structures can be used. In this embodiment, examples of a structure of a layer containing a light-emitting organic compound interposed between a pair of electrodes, which can be used in a light-emitting panel according to one embodiment of the present invention, will be described with reference to FIGS. 5A to 5E.

Among layers included in a layer containing a light-emitting organic compound described in this embodiment, a layer which easily becomes a region with particularly low electrical resistance is a charge generation layer containing a substance having a high hole-transport property and an acceptor substance with respect to the substance having a high hole-transport property and/or an electron-injection buffer containing a substance having a high electron-transport property and a donor substance with respect to the substance having a high electron-transport property. This is because each layer contains a substance which generates a carrier (specifically, an acceptor substance or a donor substance), which leads to a reduction in electrical resistance.

Even in the case where a first electrode of one light-emitting element and a first electrode of the other light-emitting element are apart from each other, when such a layer with reduced electrical resistance is provided closer to the first electrode than a light-emitting unit, current flows from the first electrode of the one light-emitting element to the other light-emitting element or from the first electrode of the other light-emitting element to the one light-emitting element, through the layer with reduced electrical resistance, so that crosstalk occurs.

Thus, one embodiment of the present invention also includes a structure in which the thickness of a portion of the charge generation layer containing a substance having a high hole-transport property and an acceptor substance with respect to the substance having a high hole-transport property and/or the thickness of a portion of the electron-injection buffer containing a substance having a high electron-transport property and a donor substance with respect to the substance having a high electron-transport property, which overlaps with the side surface of the partition provided between the one light-emitting element and the other light-emitting element, is smaller than those of the other portions. Such a structure can increase electrical resistance of layers, e.g., a charge generation layer and an electron-injection buffer, whereby current flowing through the layer containing a light-emitting organic compound between the one light-emitting element and the other light-emitting element can be suppressed. As a result, a light-emitting panel in which the occurrence of crosstalk is suppressed can be provided.

The thickness of the region with low electrical resistance, e.g., the charge generation layer or the electron-injection buffer, is preferably small. Specifically, the thickness of the region with low electrical resistance is preferably less than or equal to 100 nm, particularly less than or equal to 10 nm, in the portion which overlaps with the first electrode.

With such a structure, the thickness of the region with low electrical resistance is less than or equal to 50 nm, preferably less than or equal to 5 nm in the portion which overlaps with the side surface of the insulating partition. Thus, a portion with increased electrical resistance is formed on the side surface of the partition. When the thickness of the region with low electrical resistance is less than or equal to 5 nm, the layer is divided and becomes discontinuous in the direction in which the layer spreads, so that electrical resistance is drastically increased. As a result, a light-emitting panel in which the occurrence of crosstalk is suppressed can be provided.

The light-emitting element described in this embodiment includes a first electrode, a second electrode, and a layer containing a light-emitting organic compound (hereinafter referred to as an EL layer) provided between the first electrode and the second electrode. One of the first electrode and the second electrode serves as an anode, and the other serves as a cathode. The EL layer is provided between the first electrode and the second electrode, and a structure of the EL layer may be selected as appropriate in accordance with materials of the first electrode and the second electrode. Examples of the structure of the light-emitting element will be described below; needless to say, the structure of the light-emitting element is not limited to the examples.

<Structure Example 1 of Light-Emitting Element>

Figure 5A:
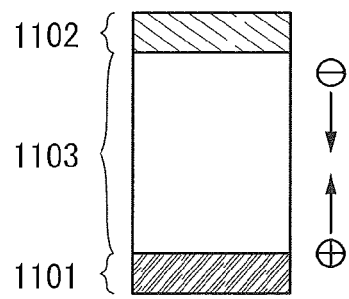
FIGS. 5A to 5E each illustrate a structure of a light-emitting element according to one embodiment.

An example of a structure of a light-emitting element is illustrated in FIG. 5A. In the light-emitting element illustrated in FIG. 5A, an EL layer is provided between an anode 1101 and a cathode 1102.

When voltage higher than the threshold voltage of the light-emitting element is applied between the anode 1101 and the cathode 1102, holes are injected to the EL layer from the anode 1101 side and electrons are injected to the EL layer from the cathode 1102 side. The injected electrons and holes are recombined in the EL layer, so that a light-emitting substance contained in the EL layer emits light.

In this specification, a layer or a stacked body which includes one region where electrons and holes injected from both ends are recombined is referred to as a light-emitting unit. Therefore, it can be said that Structure Example 1 of the light-emitting element includes one light-emitting unit.

A light-emitting unit 1103 includes at least a light-emitting layer containing a light-emitting substance, and may have a structure in which the light-emitting layer and a layer other than the light-emitting layer are stacked. Examples of the layer other than the light-emitting layer include a layer containing a substance having a high hole-injection property, a layer containing a substance having a high hole-transport property, a layer containing a substance having a poor hole-transport property (a substance which blocks holes), a layer containing a substance having a high electron-transport property, a layer containing a substance having a high electron-injection property, and a layer containing a substance having a bipolar property (a substance having a high electron-transport property and a high hole-transport property).

Figure 5B:
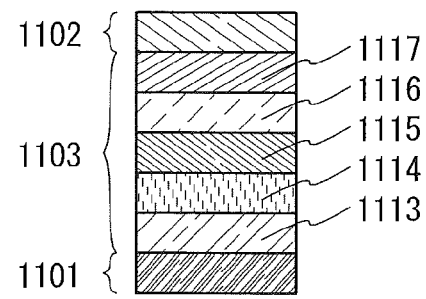

An example of a specific structure of the light-emitting unit 1103 is illustrated in FIG. 5B. In the light-emitting unit 1103 illustrated in FIG. 5B, a hole-injection layer 1113, a hole-transport layer 1114, a light-emitting layer 1115, an electron-transport layer 1116, and an electron-injection layer 1117 are stacked in this order from the anode 1101 side.

<Structure Example 2 of Light-Emitting Element>

Figure 5C:
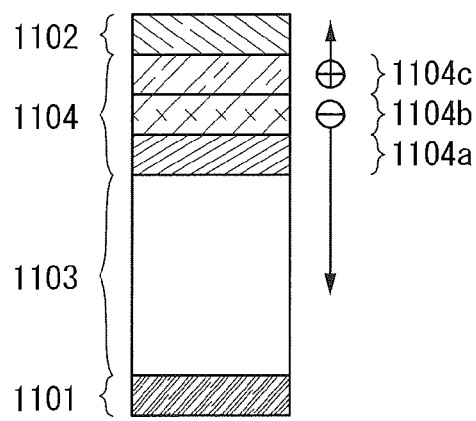

Another example of a structure of a light-emitting element is illustrated in FIG. 5C. In the light-emitting element illustrated in FIG. 5C, an EL layer including the light-emitting unit 1103 is provided between the anode 1101 and the cathode 1102. Further, an intermediate layer 1104 is provided between the cathode 1102 and the light-emitting unit 1103. Note that a structure similar to that of the light-emitting unit in Structure Example 1 of the light-emitting element, which is described above, can be applied to the light-emitting unit 1103 in Structure Example 2 of the light-emitting element and that the description of Structure Example 1 of the light-emitting element can be referred to for the details.

The intermediate layer 1104 is formed to include at least a charge generation region, and may have a structure in which the charge generation region and a layer other than the charge generation region are stacked. For example, a structure can be employed in which a first charge generation region 1104c, an electron-relay layer 1104b, and an electron-injection buffer 1104a are stacked in this order from the cathode 1102 side.

The behavior of electrons and holes in the intermediate layer 1104 will be described. When voltage higher than the threshold voltage of the light-emitting element is applied between the anode 1101 and the cathode 1102, holes and electrons are generated in the first charge generation region 1104c, and the holes move into the cathode 1102 and the electrons move into the electron-relay layer 1104b. The electron-relay layer 1104b has a high electron-transport property and immediately transfers the electrons generated in the first charge generation region 1104c to the electron-injection buffer 1104a. The electron-injection buffer 1104a can reduce a barrier against electron injection into the light-emitting unit 1103, so that the efficiency of the electron injection into the light-emitting unit 1103 can be improved. Thus, the electrons generated in the first charge generation region 1104c are injected into the LUMO level of the light-emitting unit 1103 through the electron-relay layer 1104b and the electron-injection buffer 1104a.

In addition, the electron-relay layer 1104b can prevent interaction in which the substance contained in the first charge generation region 1104c and the substance included in the electron-injection buffer 1104a react with each other at the interface therebetween to impair the functions of the electron-injection buffer 1104a and the first charge generation region 1104c.

The range of choices of materials that can be used for the cathode in Structure Example 2 of the light-emitting element is wider than that of materials that can be used for the cathode in Structure Example 1 of the light-emitting element. This is because the cathode in Structure Example 2 can be formed using a material having a relatively high work function as long as the cathode receives holes generated in the intermediate layer.

<Structure Example 3 of Light-Emitting Element>

Figure 5D:
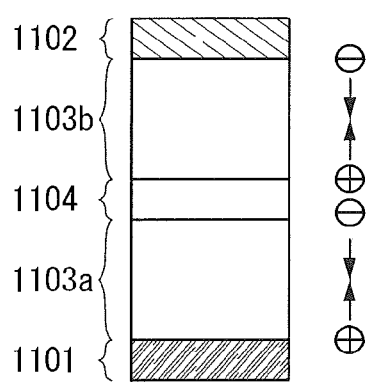
Figure 5E:
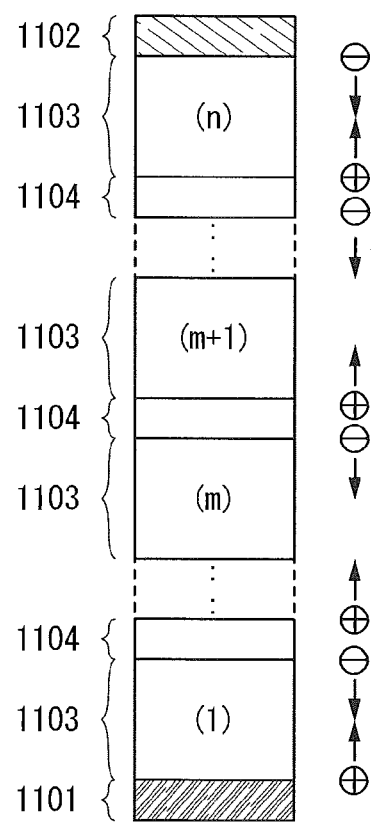

Another example of the structure of a light-emitting element is illustrated in FIG. 5D. In the light-emitting element illustrated in FIG. 5D, an EL layer including two light-emitting units is provided between the anode 1101 and the cathode 1102. Furthermore, the intermediate layer 1104 is provided between a first light-emitting unit 1103a and a second light-emitting unit 1103b.

Note that the number of the light-emitting units provided between the anode and the cathode is not limited to two. A light-emitting element illustrated in FIG. 5E has a structure in which a plurality of light-emitting units 1103 are stacked, that is, a so-called tandem structure. Note that in the case where n (n is a natural number greater than or equal to 2) light-emitting units 1103 are provided between the anode and the cathode, the intermediate layer 1104 is provided between an m-th (m is a natural number greater than or equal to 1 and less than or equal to n−1) light-emitting unit and an (m+1)-th light-emitting unit.

Note that a structure similar to that in Structure Example 1 of the light-emitting element can be applied to the light-emitting unit 1103 in Structure Example 3 of the light-emitting element; a structure similar to that in Structure Example 2 of the light-emitting element can be applied to the intermediate layer 1104 in Structure Example 3 of the light-emitting element. Therefore, the description of Structure Example 1 of the light-emitting element or the description of Structure Example 2 of the light-emitting element can be referred to for the details.

The behavior of electrons and holes in the intermediate layer 1104 provided between the light-emitting units will be described. When voltage higher than the threshold voltage of the light-emitting element is applied between the anode 1101 and the cathode 1102, holes and electrons are generated in the intermediate layer 1104, and the holes move into the light-emitting unit provided on the cathode 1102 side and the electrons move into the light-emitting unit provided on the anode side. The holes injected into the light-emitting unit provided on the cathode side are recombined with the electrons injected from the cathode side, so that a light-emitting substance contained in the light-emitting unit emits light. The electrons injected into the light-emitting unit provided on the anode side are recombined with the holes injected from the anode side, so that a light-emitting substance contained in the light-emitting unit emits light. Thus, the holes and electrons generated in the intermediate layer 1104 cause light emission in the respective light-emitting units.

Note that the light-emitting units can be provided in contact with each other when these light-emitting units allow the same structure as the intermediate layer to be formed therebetween. Specifically, when one surface of the light-emitting unit is provided with a charge generation region, the charge generation region functions as a first charge generation region of the intermediate layer; thus, the light-emitting units can be provided in contact with each other.

Structure Examples 1 to 3 of the light-emitting element can be implemented in combination. For example, an intermediate layer may be provided between the cathode and the light-emitting unit in Structure Example 3 of the light-emitting element.

<Material for Light-Emitting Element>

Next, specific materials that can be used for the light-emitting elements having the above structures will be described; materials for the anode, the cathode, and the EL layer will be described in this order.

<Material for Anode>

The anode 1101 is preferably formed using a metal, an alloy, an electrically conductive compound, a mixture of these materials, or the like which has a high work function (specifically, a work function of 4.0 eV or higher). Specific examples are indium tin oxide (ITO), indium tin oxide containing silicon or silicon oxide, indium zinc oxide, indium oxide containing tungsten oxide and zinc oxide, and the like.

Such conductive metal oxide films are usually formed by a sputtering method, but may also be formed by application of a sol-gel method or the like. For example, an indium-zinc oxide film can be formed by a sputtering method using a target in which zinc oxide is added to indium oxide at greater than or equal to 1 wt % and less than or equal to 20 wt %. A film of indium oxide containing tungsten oxide and zinc oxide can be formed by a sputtering method using a target in which tungsten oxide and zinc oxide are added to indium oxide at greater than or equal to 0.5 wt % and less than or equal to 5 wt % and greater than or equal to 0.1 wt % and less than or equal to 1 wt %, respectively.

Besides, as examples of the material for the anode 1101, the following can be given: gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (e.g., titanium nitride), molybdenum oxide, vanadium oxide, ruthenium oxide, tungsten oxide, manganese oxide, titanium oxide, and the like. A conductive polymer such as poly(3,4-ethylenedioxythiophene)/poly(styrenesulfonic acid) (PEDOT/PSS) or polyaniline/poly(styrenesulfonic acid) (PAni/PSS) may also be used.

Note that in the case where a second charge generation region is provided in contact with the anode 1101, a variety of conductive materials can be used for the anode 1101 regardless of their work functions. Specifically, besides a material which has a high work function, a material which has a low work function can also be used. Materials for forming the second charge generation region will be described later together with materials for forming the first charge generation region.

<Material for Cathode>

In the case where the first charge generation region 1104c is provided between the cathode 1102 and the light-emitting unit 1103 to be in contact with the cathode 1102, a variety of conductive materials can be used for the cathode 1102 regardless of their work functions.

Note that at least one of the cathode 1102 and the anode 1101 is formed using a conductive film that transmits visible light. For the conductive film which transmits visible light, for example, indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, and indium tin oxide to which silicon oxide is added can be given. Further, a metal thin film whose thickness is set so that light is transmitted (preferably, thickness approximately greater than or equal to 5 nm and less than or equal to 30 nm) can also be used.

<Material for EL Layer>

Specific examples of materials for the layers included in the light-emitting unit 1103 will be given below.

The hole-injection layer is a layer containing a substance having a high hole-injection property. As the substance having a high hole-injection property, for example, molybdenum oxide, vanadium oxide, ruthenium oxide, tungsten oxide, manganese oxide, or the like can be used. In addition, it is possible to use a phthalocyanine-based compound such as phthalocyanine ($H_2Pc$) or copper phthalocyanine (CuPc), a high molecule such as poly(3,4-ethylenedioxythiophene)/poly(styrenesulfonate) (PEDOT/PSS), or the like to form the hole-injection layer.

Note that the hole-injection layer may be formed using the second charge generation region. When the second charge generation region is used for the hole-injection layer, a variety of conductive materials can be used for the anode 1101 regardless of their work functions as described above. Materials for forming the second charge generation region will be described later together with materials for forming the first charge generation region.

<Hole-Transport Layer>

The hole-transport layer is a layer containing a substance having a high hole-transport property. The hole-transport layer may have a stacked layer of two or more layers containing a substance having a high hole-transport property without limitation to a single layer. A substance having a hole-transport property higher than an electron-transport property is used. In particular, a substance having a hole mobility of $10^{-6}$ $cm^2/Vs$ or higher is preferably used, in which case the driving voltage of the light-emitting element can be reduced.

Examples of the substance having a high hole-transport property include aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4-phenyl-4'-(9-phenylfluoren-9-yl)triphenylamine (abbreviation: BPAFLP), 4,4',4''-tris(carbazol-9-yl)triphenylamine (abbreviation: TCTA), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB). Examples further include 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation:

PCzPCN1), and the like. Examples further include carbazole derivatives such as 4,4'-di(N-carbazolyl)biphenyl (abbreviation: CBP), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA).

In addition to the above substances, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: Poly-TPD) can be used for the hole-transport layer.

<Light-Emitting Layer>

The light-emitting layer is a layer containing a light-emitting substance. The light-emitting layer may have a stacked layer of two or more layers containing a light-emitting substance without limitation to a single layer. A fluorescent compound or a phosphorescent compound can be used as the light-emitting substance. A phosphorescent compound is preferably used as the light-emitting substance, in which case the emission efficiency of the light-emitting element can be increased.

Examples of a fluorescent compound that can be used as the light-emitting substance include N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phen ylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2, 7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N'N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5, 11-diamine (abbreviation: p-mPhTD), 7,14-diphenyl-NN,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H, 5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H, 5H-benzo[ij]quinolizin-9-yl)ethenyl]-4H-pyran-4-ylidene}propanedinitrile (abbreviation: BisDCJTM), SD1 (product name; manufactured by SFC Co., Ltd), and the like.

Examples of a phosphorescent compound that can be used as the light-emitting substance include bis[2-(4',6'-difluorophenyl)pyridinato-N,$C^{2'}$]iridium(III)tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis[2-(3',5'-bistrifluoromethylphenyl)pyridinato-N, $C^{2'}$]iridium(III) picolinate (abbreviation: Ir(CF$_3$ppy)$_2$(pic)), bis[2-(4',6'-difluorophenyl)pyridinato-N,$C^{2'}$]iridium(III) acetylacetonate (abbreviation: FIracac), tris(2-phenylpyridinato)iridium(III) (abbreviation: Ir(ppy)$_3$), bis(2-phenylpyridinato)iridium(III) acetylacetonate (abbreviation: Ir(ppy)$_2$(acac)), bis(benzo[h]quinolinato)iridium(III) acetylacetonate (abbreviation: Ir(bzq)$_2$(acac)), bis(2,4-diphenyl-1,3-oxazolato-N,$C^{2'}$)iridium(III) acetylacetonate (abbreviation: Ir(dpo)$_2$(acac)), bis{2-[4'-(perfluorophenyl)phenyl]pyridinato-N,$C^{2'}$}iridium(III) acetylacetonate (abbreviation: Ir(p-PF-ph)$_2$(acac)), bis(2-phenylbenzothiazolato-N,$C^{2'}$) iridium(III) acetylacetonate (abbreviation: Ir(bt)$_2$(acac)), bis [2-(2'-benzo[4,5-a]thienyl)pyridinato-N,$C^{3'}$]iridium(III) acetylacetonate (abbreviation: Ir(btp)$_2$(acac)), bis(1-phenylisoquinolinato-N,$C^{2'}$)iridium(III) acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$ (acac)), (acetylacetonato)bis(2,3,5-triphenylpyrazinato)iridium(III) (abbreviation: Ir(tppr)$_2$(acac)), (2,3,7,8,12,13,17,18-octaethyl-21H,23H-porphine)platinum (II) (abbreviation: PtOEP), tris(acetylacetonato) (monophenanthroline)terbium (III) (abbreviation: Tb(acac)$_3$ (Phen)), tris(1,3-diphenyl-1,3-propanedionato)(monophenanthroline)europium(III) (abbreviation: Eu(DBM)$_3$(Phen)), tris[1-(2-thenoyl)-3,3,3-trifluoroacetonato] (monophenanthroline)europium(III) (abbreviation: Eu(TTA)$_3$(Phen)), bis(2,3,5-triphenylpyrazinato) (dipivaloylmethanato)iridium(III) (abbreviation: Ir(tppr)$_2$(dpm)), and the like.

The light-emitting substance is preferably dispersed in a host material. A host material preferably has higher excitation energy than the light-emitting substance.

As the host material, it is possible to use an aromatic amine compound such as NPB, TPD, TCTA, TDATA, MTDATA, or BSPB; or a carbazole derivative such as PCzPCA1, PCzPCA2, PCzPCN1, CBP, TCPB, CzPA, 9-phenyl-3-[4-(10-phenyl-9-anthryl)phenyl]-9H-carbazole (abbreviation: PCzPA), or 4-phenyl-4'-(9-phenyl-9H-carbazol-3-yl)triphenylamine (abbreviation: PCBA1BP). Alternatively, it is possible to use a substance which has a high hole-transport property and includes a high molecular compound, such as PVK, PVTPA, PTPDMA, or Poly-TPD. Alternatively, it is possible to use a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq). Alternatively, it is possible to use a metal complex having an oxazole-based or thiazole-based ligand, such as bis[2-(2'-hydroxyphenyl)benzoxazolato]zinc (abbreviation: Zn(BOX)$_2$) or bis[2-(2'-hydroxyphenyl)benzothiazolato]zinc (abbreviation: Zn(BTZ)$_2$). Further alternatively, it is possible to use a substance having a high electron-transport property, such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]carbazole (abbreviation: CO11), 3-(4-biphenylyl)-4-phenyl-5-(4-tert-butylphenyl)-1,2,4-triazole (abbreviation: TAZ), bathophenanthroline (abbreviation: BPhen), or bathocuproine (abbreviation: BCP).

<Electron-Transport Layer>

The electron-transport layer is a layer containing a substance having a high electron-transport property. The electron-transport layer may have a stacked layer of two or more layers containing a substance having a high electron-transport property without limitation to a single layer. A substance having an electron-transport property higher than a hole-transport property is used. In particular, a substance having an electron mobility of $10^{-6}$ cm$^2$/Vs or higher is preferably used, in which case the driving voltage of the light-emitting element can be reduced.

As the substance having a high electron-transport property, for example, a metal complex having a quinoline skeleton or a benzoquinoline skeleton, such as Alq, Almq$_3$, BeBq$_2$, or BAlq, or the like can be used. Alternatively, a metal complex having an oxazole-based or thiazole-based ligand, such as Zn(BOX)$_2$ or Zn(BTZ)$_2$, or the like can be used. Further alternatively, PBD, OXD-7, CO11, TAZ, BPhen, BCP, 2-[4-(dibenzothiophen-4-yl)phenyl]-1-phenyl-1H-benzimidazole (abbreviation: DBTBIm-II), or the like can be used.

Besides the above-described materials, the electron-transport layer can be formed using a high molecular compound such as poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-bipyridine-6,6'-diyl)] (abbreviation: PF-BPy).

<Electron-Injection Layer>

The electron-injection layer is a layer containing a substance having a high electron-injection property. The electron-injection layer may have a stacked layer of two or more layers containing a substance having a high electron-injection property without limitation to a single layer. The electron-injection layer is preferably provided, in which case the efficiency of electron injection from the cathode 1102 can be increased, so that the driving voltage of the light-emitting element can be reduced.

As the substance having a high electron-injection property, the following can be given: an alkali metal and an alkaline earth metal such as lithium (Li), cesium (Cs), or calcium (Ca), and a compound thereof, such as lithium fluoride (LiF), cesium fluoride (CsF), or calcium fluoride (CaF$_2$). Alternatively, a layer containing a substance having an electron-transport property and an alkali metal, an alkaline earth metal, magnesium (Mg), or a compound thereof (e.g., an Alq layer containing magnesium (Mg)) can be used.

<Material for Charge Generation Region>

The first charge generation region 1104c and the second charge generation region are regions containing a substance having a high hole-transport property and an acceptor substance with respect to the substance having a high hole-transport property. The charge generation region may contain a substance having a high hole-transport property and an acceptor substance in the same film or may be a stack of a layer containing a substance having a high hole-transport property and a layer containing an acceptor substance with respect to the substance having a high hole-transport property. Note that in the case of a stacked-layer structure in which the first charge generation region is provided on the cathode side, the layer containing the substance having a high hole-transport property is in contact with the cathode 1102, and in the case of a stacked-layer structure in which the second charge generation region is provided on the anode side, the layer containing an acceptor substance is in contact with the anode 1101.

Note that the acceptor substance is preferably added to the charge generation region so that the mass ratio of the acceptor substance to the substance having a high hole-transport property is from 0.1:1 to 4.0:1.

As the acceptor substance that is used for the charge generation region, a transition metal oxide and an oxide of a metal belonging to any of Groups 4 to 8 of the periodic table can be given. Specifically, molybdenum oxide is particularly preferable. Note that molybdenum oxide has a low hygroscopic property.

As the substance having a high hole-transport property that is used for the charge generation region, any of a variety of organic compounds such as an aromatic amine compound, a carbazole derivative, an aromatic hydrocarbon, and a high molecular compound (such as an oligomer, a dendrimer, or a polymer) can be used. Specifically, a substance having a hole mobility of $10^{-6}$ cm$^2$/Vs or higher is preferably used. Note that any other substance may be used as long as the hole transport property thereof is higher than the electron-transport property thereof.

<Material for Electron-Relay Layer>

The electron-relay layer 1104b is a layer that can immediately receive electrons extracted by the acceptor substance in the first charge generation region 1104c. Therefore, the electron-relay layer 1104b is a layer containing a substance having a high electron-transport property, and the LUMO level of the electron-relay layer 1104b is positioned between the acceptor level of the acceptor substance in the first charge generation region 1104c and the LUMO level of the light-emitting unit 1103 with which the electron-relay layer is in contact. Specifically, it is preferable that the LUMO level of the electron-relay layer 1104b be approximately greater than or equal to −5.0 eV and less than or equal to −3.0 eV.

As examples of the substance used for the electron-relay layer 1104b, a perylene derivative and a nitrogen-containing condensed aromatic compound can be given. Note that a nitrogen-containing condensed aromatic compound is preferably used for the electron-relay layer 1104b because of its stability. Among nitrogen-containing condensed aromatic compounds, a compound having an electron-withdrawing group such as a cyano group or a fluoro group is preferably used, in which case electrons can be received more easily in the electron-relay layer 1104b.

As specific examples of the perylene derivative, the following can be given: 3,4,9,10-perylenetetracarboxylic dianhydride (abbreviation: PTCDA), 3,4,9,10-perylenetetracarboxylic bisbenzimidazole (abbreviation: PTCBI), N,N'-dioctyl-3,4,9,10-perylenetetracarboxylic diimide (abbreviation: PTCDI-C8H), N,N'-dihexyl-3,4,9,10-perylenetetracarboxylic diimide (abbreviation: Hex PTC), and the like.

As specific examples of the nitrogen-containing condensed aromatic compound, the following can be given: pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), 2,3-bis(4-fluorophenyl)pyrido[2,3-b]pyrazine (abbreviation: F2PYPR), and the like.

Besides, 7,7,8,8-tetracyanoquinodimethane (abbreviation: TCNQ), 1,4,5,8-naphthalenetetracarboxylic dianhydride (abbreviation: NTCDA), perfluoropentacene, copper hexadecafluorophthalocyanine (abbreviation: $F_{16}CuPc$), N,N'-bis(2,2,3,3,4,4,5,5,6,6,7,7,8,8-pentadecafluorooctyl)-1,4,5,8-naphthalenetetracar boxylic diimide (abbreviation: NTCDI-C8F), 3',4'-dibutyl-5,5"-bis(dicyanomethylene)-5,5"-dihydro-2,2':5',2"-terthiophen (abbreviation: DCMT), methanofullerene (e.g., [6,6]-phenyl $C_{61}$ butyric acid methyl ester), or the like can be used for the electron-relay layer 1104b.

<Material for Electron-Injection Buffer>

The electron-injection buffer 1104a is a layer which facilitates electron injection from the first charge generation region 1104c into the light-emitting unit 1103. By providing the electron-injection buffer 1104a between the first charge generation region 1104c and the light-emitting unit 1103, the injection barrier therebetween can be reduced.

Any of the following substances having a high electron-injection property can be used for the electron-injection buffer 1104a: an alkali metal, an alkaline earth metal, a rare earth metal, a compound of the above metal (e.g., an alkali metal compound (e.g., an oxide such as lithium oxide, a halide, and a carbonate such as lithium carbonate or cesium carbonate), an alkaline earth metal compound (e.g., an oxide, a halide, and a carbonate), a rare earth metal compound (e.g., an oxide, a halide, and a carbonate)), and the like.

Further, in the case where the electron-injection buffer 1104a contains a substance having a high electron-transport property and a donor substance with respect to the substance having a high electron-transport property, the donor substance is preferably added so that the mass ratio of the donor substance to the substance having a high electron-transport property is from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (e.g., an oxide such as lithium oxide, a halide, and a carbonate such as lithium carbonate or cesium carbonate), an alkaline earth metal compound (e.g., an oxide, a halide, and a carbonate), and a rare earth metal compound (e.g., an oxide, a halide, and a carbonate). Note that as the substance having a high electron-transport property, a material similar to the above material for the electron-transport layer which can be formed in part of the light-emitting unit 1103 can be used.

<Method for Manufacturing Light-Emitting Element>

A method for manufacturing the light-emitting element will be described. Over the first electrode, the layers described above are combined as appropriate to form an EL layer. Any of a variety of methods (e.g., a dry process or a wet process) can be used for the EL layer depending on the material for the EL layer. For example, a vacuum evaporation method, an inkjet method, a spin coating method, or the like may be selected. Note that a different method may be employed for each layer. A second electrode is formed over the EL layer. In the above manner, the light-emitting element is manufactured.

The light-emitting element described in this embodiment can be manufactured by combining the above materials. Light emission from the above light-emitting substance can be obtained with this light-emitting element, and the emission color can be selected by changing the type of the light-emitting substance.

Further, when a plurality of light-emitting substances which emit light of different colors are used, the width of the emission spectrum can be expanded, whereby, for example, white light emission can be obtained. In order to obtain white light emission, for example, a structure may be employed in which at least two layers containing light-emitting substances are provided so that light of complementary colors is emitted. Specific examples of complementary colors are a combination of blue and yellow, a combination of blue-green and red, and the like.

Further, in order to obtain white light emission with an excellent color rendering property, an emission spectrum needs to spread through the entire visible light region. For example, layers emitting light of blue, green, and red may be provided.

Note that this embodiment can be combined with any of the other embodiments in this specification as appropriate.

(Embodiment 4)

In this embodiment, a light-emitting device including a light-emitting panel according to one embodiment of the present invention will be described with reference to FIGS. 6A and 6B. In particular, an active matrix light-emitting device and a passive matrix light-emitting device, in which light is extracted to the second electrode side (also referred to as light-emitting devices with a top-emission type) will be described. The device has the following structure: the thickness $A_1$ of a portion of a layer containing a light-emitting organic compound, which overlaps with a side surface of a partition, is smaller than ½ of the thickness $A_0$ of a portion of the layer containing a light-emitting organic compound, which is in contact with a first electrode, and the ratio ($B_1/B_0$) of the thickness $B_1$ of a portion of a second electrode, which overlaps with the side surface of the partition, and the thickness $B_0$ of a portion of the second electrode, which overlaps with the first electrode, is higher than the ratio ($A_1/A_0$).

<Active Matrix Light-Emitting Device>

Figure 6A:
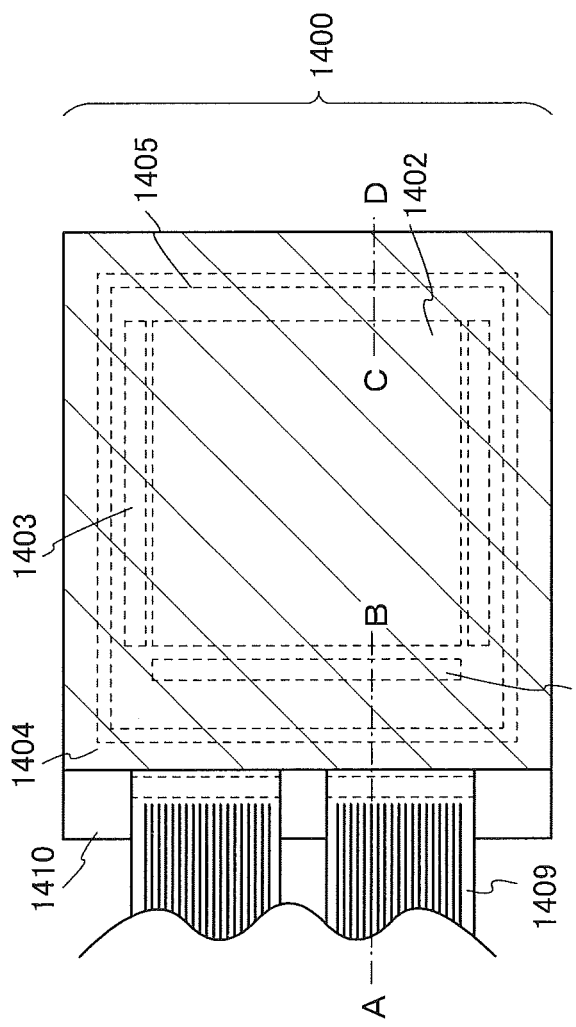
FIGS. 6A and 6B illustrate a structure of a light-emitting device according to one embodiment.
Figure 6B:
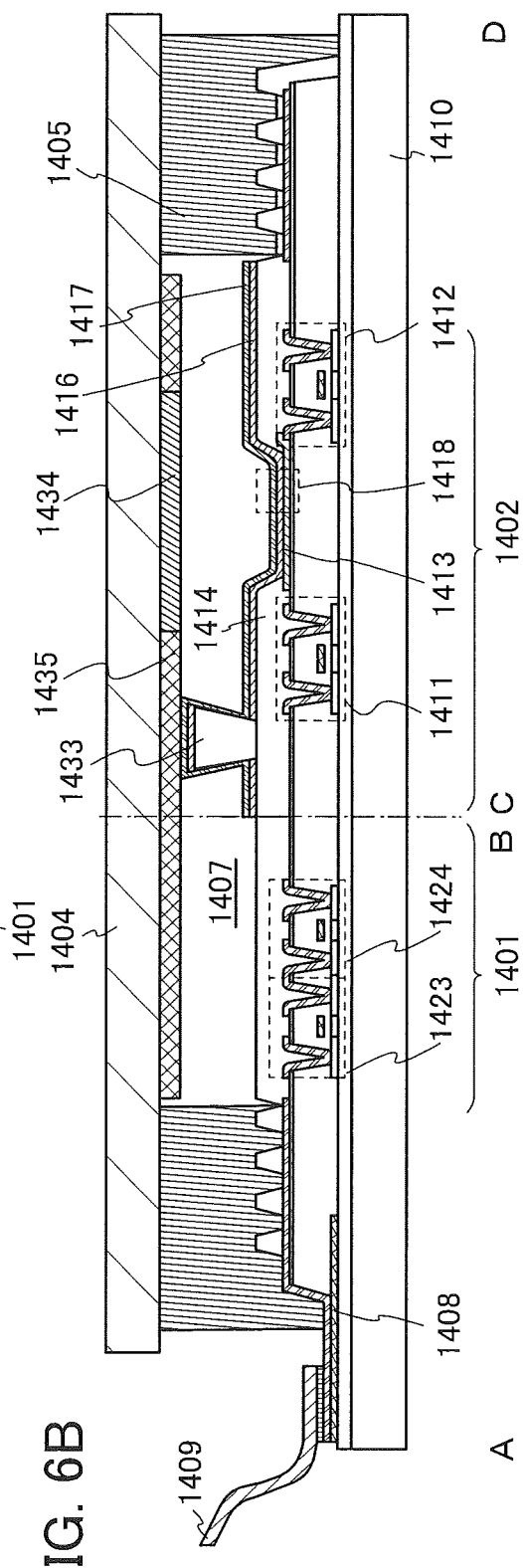

A structure in which the light-emitting panel according to one embodiment of the present invention is applied to an active matrix light-emitting device is illustrated in FIGS. 6A and 6B. Note that FIG. 6A is a top view of the light-emitting device, and FIG. 6B is a cross-sectional view taken along lines A-B and C-D in FIG. 6A.

An active matrix light-emitting device 1400 includes a driver circuit portion (source side driver circuit) 1401, a pixel portion 1402, a driver circuit portion (gate side driver circuit) 1403, a sealing substrate 1404, and a sealant 1405 (see FIG. 6A). Note that a portion enclosed by the sealant 1405 is a space.

The light-emitting device 1400 receives a video signal, a clock signal, a start signal, a reset signal, and the like from an FPC (flexible printed circuit) 1409 that is an external input terminal. Note that although only the FPC is illustrated here, the FPC may be provided with a printed wiring board (PWB). The light-emitting device in this specification includes, in its category, not only a light-emitting device itself but also a light-emitting device provided with an FPC or a PWB.

Next, the structure of the light-emitting device 1400 will be described with reference to the cross-sectional view of FIG. 6B. The light-emitting device 1400 includes a driver circuit portion including the source side driver circuit 1401 illustrated over an element substrate 1410 and the pixel portion 1402 including a pixel illustrated. Further, the light-emitting device 1400 includes a lead wiring 1408 for transmitting signals that are to be input to the source side driver circuit 1401 and the gate side driver circuit 1403.

Note that although the source side driver circuit 1401 includes a CMOS circuit in which an n-channel transistor 1423 and a p-channel transistor 1424 are combined in this embodiment, the driver circuit is not limited to this structure and may be any of a variety of circuits, such as a CMOS circuit, a PMOS circuit, or an NMOS circuit. Although a driver-integrated type in which a driver circuit is formed over the substrate is described in this embodiment, the present invention is not limited thereto, and the driver circuit can be formed not over the substrate but outside the substrate.

<Structure of Transistor>

Note that any of a variety of semiconductors can be used for a region where a channel of a transistor is formed. Specifically, an oxide semiconductor or the like can be used as well as amorphous silicon or polysilicon.

A single crystal semiconductor can be used in a region where a channel of a transistor is formed. When a single crystal semiconductor is used for a channel formation region, the size of the transistor can be reduced, which results in higher-definition pixels in a display portion.

As a single crystal semiconductor used for forming a semiconductor layer, a semiconductor substrate, typical examples of which include a single crystal semiconductor substrate formed using elements belonging to Group 14, such as a single crystal silicon substrate, a single crystal germanium substrate, or a single crystal silicon germanium substrate, and a compound semiconductor substrate (e.g., a SiC substrate, a sapphire substrate, and a GaN substrate), can be used. Preferred one is a silicon-on-insulator (SOI) substrate in which a single crystal semiconductor layer is provided on an insulating surface.

As a method for forming the SOI substrate, any of the following methods can be used: a method in which oxygen ions are implanted into a mirror-polished wafer and then heating is performed at a high temperature, whereby an oxide layer is formed at a certain depth from a surface of the wafer and a defect caused in the surface layer is eliminated; a method in which a semiconductor substrate is separated by utilizing the growth of microvoids, which are formed by hydrogen ion irradiation, by heat treatment; a method in which a single crystal semiconductor layer is formed on an insulating surface by crystal growth; and the like.

In this embodiment, ions are added through one surface of a single crystal semiconductor substrate, an embrittlement layer is formed at a certain depth from the one surface of the single crystal semiconductor substrate, and an insulating layer is formed on the one surface of the single crystal semiconductor substrate or over the element substrate 1410. Heat treatment is performed in a state where the single crystal semiconductor substrate and the element substrate 1410 are bonded to each other with the insulating layer interposed therebetween, so that a crack is generated in the embrittlement layer and the single crystal semiconductor substrate is separated along the embrittlement layer. Thus, a single crystal semiconductor layer, which is separated from the single crystal semiconductor substrate, is formed as a semiconductor layer over the element substrate 1410. Note that a glass substrate can be used as the element substrate 1410.

Regions electrically insulated from each other may be formed in the semiconductor substrate, and transistors 1411 and 1412 may be manufactured using the regions electrically insulated from each other.

When a channel formation region is formed using a single crystal semiconductor, variations in electrical characteristics, such as threshold voltage, between transistors due to bonding defects at grain boundaries can be reduced. Thus, in the display device according to one embodiment of the present invention, the light-emitting elements can be operated normally without placing a circuit for compensating threshold voltage in each pixel. The number of circuit components per pixel can therefore be reduced, which results in an increase in the flexibility in layout. Thus, a high-definition display device can be obtained. For example, a display device having a matrix of a plurality of pixels, specifically greater than or equal to 350 pixels per inch (i.e., the horizontal resolution is greater than or equal to 350 pixels per inch (ppi)), more preferably greater than or equal to 400 pixels per inch (i.e., the horizontal resolution is greater than or equal to 400 ppi) can be obtained.

Moreover, a transistor in which a channel formation region is formed using a single crystal semiconductor can be downsized while current drive capability is kept high. When the downsized transistor is used, a reduction in the area of a circuit portion that does not contribute to display, which results in an increase in the display area in the display portion and a reduction in the frame size of the display device.

<Structure of Pixel Portion>

The pixel portion 1402 is provided with a plurality of pixels. The pixel includes a light-emitting element 1418, the current controlling transistor 1412 whose drain electrode is connected to a first electrode 1413 of the light-emitting element 1418, and the switching transistor 1411. For the pixel portion 1402, for example, the structure described in Embodiment 1 can be employed.

The light-emitting element 1418 included in the light-emitting panel includes the first electrode 1413, a second electrode 1417, and a layer 1416 containing a light-emitting organic compound. Note that a partition 1414 is formed so as to cover an end portion of the first electrode 1413.

The partition 1414 is formed to have a curved surface with curvature at an upper end portion or a lower end portion thereof. The partition 1414 can be formed using either a negative photosensitive resin which becomes insoluble in an etchant by light irradiation or a positive photosensitive resin which becomes soluble in an etchant by light irradiation. For example, in the case of using positive photosensitive acrylic as a material for the partition 1414, it is preferable that the partition 1414 be formed so as to have a curved surface with radius of curvature (0.2 mm to 3 μm) only at the upper end portion thereof. Here, the partition 1414 is formed using a positive photosensitive polyimide film.

Note that when the partition has a light-blocking property, reflection of external light on a reflective film included in the light-emitting panel can be suppressed. When a reflective film which extends outside the light-emitting element 1418 reflects external light, the contrast of the light-emitting device is lowered; for that reason, bright light emission cannot be obtained. In the case where the partition has a light-blocking property, the partition can be formed using a resin layer colored with black.

As a structure of the light-emitting element 1418, the structure of the light-emitting element described in Embodiment 3 can be employed, for example.

Specifically, a structure in which white light is emitted can be employed for the layer 1416 containing a light-emitting organic compound.

A color filter 1434 can be provided so as to overlap with the light-emitting element 1418. In addition, a light-blocking film 1435 (also referred to as a black matrix) can be provided so as to overlap a partition between adjacent light-emitting elements. Note that the color filter 1434 and the light-blocking film 1435 can be provided over the sealing substrate 1404.

With the first electrode 1413 and the second electrode 1417 of the light-emitting element 1418, a micro resonator (also referred to as microcavity) can be formed. For example, a conductive film which reflects light emitted from the layer 1416 containing a light-emitting organic compound is used as the first electrode 1413, and a semi-transmissive and semi-reflective conductive film which reflects part of light and transmits part of light is used as the second electrode 1417.

An optical adjustment layer can be provided between the first electrode and the second electrode. The optical adjustment layer is a layer which adjusts the optical path length between the reflective first electrode 1413 and the semi-transmissive and semi-reflective second electrode 1417. By adjustment of the thickness of the optical adjustment layer, the wavelength of light preferentially extracted from the second electrode 1417 can be adjusted.

For a material which can be used for the optical adjustment layer, a layer containing a light-emitting organic compound can be used. For example, the thickness of the optical adjustment layer may be adjusted using a charge generation region. In particular, a region containing a substance having a high hole-transport property and an acceptor substance with respect to the substance having a high hole-transport property is preferably used for the optical adjustment layer because an increase of driving voltage can be suppressed even when the optical adjustment layer has a large thickness.

For another material which can be used for the optical adjustment layer, a light-transmitting conductive film which transmits light emitted from the layer 1416 containing a light-emitting organic compound can be used. For example, the light-transmitting conductive film is stacked on a surface of a reflective conductive film; thus, the first electrode 1413 can be formed. Such a structure is preferable because the thickness of an optical adjustment layer of an adjacent first electrode is easily changed.

<Sealing Structure>

The light-emitting device 1400 described in this embodiment has a structure in which the light-emitting element 1418 is sealed in a space 1407 enclosed by the element substrate 1410, the sealing substrate 1404, and the sealant 1405. Note that the space 1407 is filled with a filler. There are cases where the space 1407 is filled with an inert gas (such as nitrogen or argon) or the sealant 1405. Further, a material for adsorbing an impurity, such as a desiccant, may be provided.

The sealant 1405 and the sealing substrate 1404 are desirably formed using a material which does not transmit an impurity in the air (e.g. moisture or oxygen) as much as possible. An epoxy-based resin, glass frit, or the like can be used for the sealant 1405.

For a material which can be used for the sealing substrate 1404, a glass substrate, a quartz substrate, a plastic substrate formed of polyvinyl fluoride (PVF), polyester, acrylic, or the like, fiberglass-reinforced plastics (FRP), or the like can be used.

A spacer 1433 can be provided over the partition 1414. The spacer 1433 may have a spherical shape, a columnar shape, and/or may exhibit a rounded top surface. Further, the spacer 1433 may be made of an electrically insulating material. By providing the spacer 1433 over the partition 1414, the sealing substrate 1404 which is bent by application of external force can be prevented from damaging the light-emitting element 1418.

The above-described active matrix light-emitting device according to one embodiment of the present invention is provided with a light-emitting panel according to one embodiment of the present invention having a structure in which the thickness $A_1$ of the portion of the layer containing a light-emitting organic compound, which overlaps with the side surface of the partition, is smaller than ½ of the thickness $A_0$ of the portion of the layer containing a light-emitting organic compound, which is in contact with the first electrode, and the ratio ($B_1/B_0$) of the thickness $B_1$ of the portion of the second electrode, which overlaps with the side surface of the partition, to the thickness $B_0$ of the portion of the second electrode, which overlaps with the first electrode, is higher than the ratio ($A_1/A_0$). As a result, a light-emitting device in which the occurrence of crosstalk is suppressed can be provided.

(Embodiment 5)

In this embodiment, examples of a light-emitting device provided with a light-emitting panel of one embodiment of the present invention in which the thickness $A_1$ of a portion of a layer containing a light-emitting organic compound, which overlaps with a side surface of a partition, is smaller than ½ of the thickness $A_0$ of a portion of the layer containing a light-emitting organic compound, which is in contact with a first electrode, and the ratio ($B_1/B_0$) of the thickness $B_1$ of a portion of a second electrode, which overlaps with the side surface of the partition, to the thickness $B_0$ of a portion of the second electrode, which overlaps with the first electrode, is higher than the ratio ($A_1/A_0$), will be described with reference to FIGS. 7A to 7E.

Examples of the electronic devices to which the light-emitting device is applied are television devices (also referred to as TV or television receivers), monitors for computers and the like, cameras such as digital cameras and digital video cameras, digital photo frames, cellular phones (also referred to as portable telephone devices), portable game machines, portable information terminals, audio playback devices, large game machines such as pachinko machines, and the like. Specific examples of these electronic devices are illustrated in FIGS. 7A to 7E.

Figure 7A:
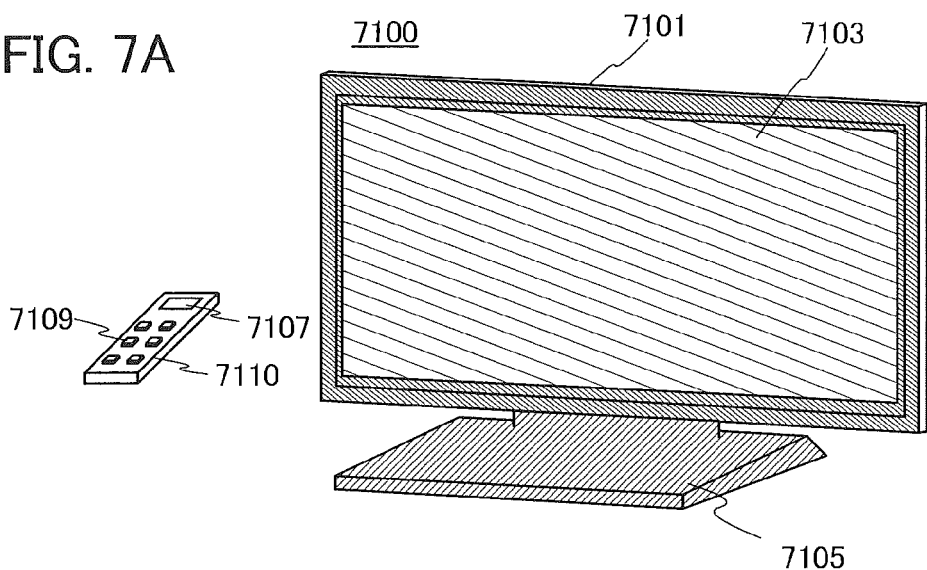
FIGS. 7A to 7E each illustrate a structure of a light-emitting device according to one embodiment.

FIG. 7A illustrates an example of a television device. In a television device 7100, a display portion 7103 is incorporated in a housing 7101. The display portion 7103 is capable of displaying images, and the light-emitting device can be used for the display portion 7103. In addition, here, the housing 7101 is supported by a stand 7105.

The television device 7100 can be operated by an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the receiver, a general television broadcast can be received. Furthermore, when the television device 7100 is connected to a communication network by wired or wireless connection via the modem, one-way (from a transmitter to a receiver) or two-way (between a transmitter and a receiver, between receivers, or the like) data communication can be performed.

Figure 7B:
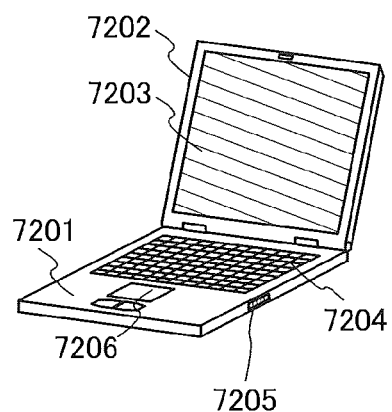

FIG. 7B illustrates a computer, which includes a main body 7201, a housing 7202, a display portion 7203, a keyboard 7204, an external connecting port 7205, a pointing device 7206, and the like. Note that this computer is manufactured using the light-emitting device for the display portion 7203.

Figure 7C:
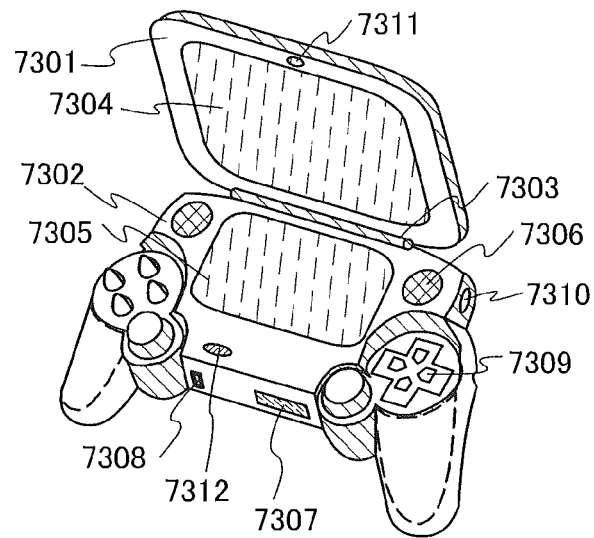

FIG. 7C illustrates a portable game machine, which includes two housings, a housing 7301 and a housing 7302, which are connected with a joint portion 7303 so that the portable game machine can be opened or folded. A display portion 7304 is incorporated in the housing 7301 and a display portion 7305 is incorporated in the housing 7302. In addition, the portable game machine illustrated in FIG. 7C includes a speaker portion 7306, a recording medium insertion portion 7307, an LED lamp 7308, an input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 7312), and the like. Needless to say, the structure of the portable game machine is not limited to the above as long as a light-emitting device can be used for at least either the display portion 7304 or the display portion 7305, or both, and may include other accessories as appropriate. The portable game machine illustrated in FIG. 7C has a function of reading out a program or data stored in a storage medium to display it on the display portion, and a function of sharing information with another portable game machine by wireless communication. The portable game machine in FIG. 7C can have a variety of functions without limitation to the above functions.

Figure 7D:
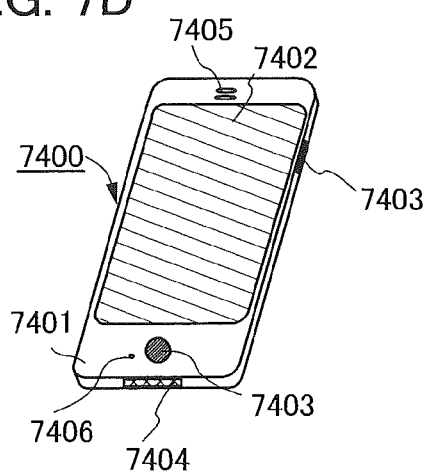

FIG. 7D illustrates an example of a mobile phone. The mobile phone 7400 is provided with a display portion 7402 incorporated in a housing 7401, operation buttons 7403, an external connection port 7404, a speaker 7405, a microphone 7406, and the like. Note that the mobile phone 7400 is manufactured using the light-emitting device for the display portion 7402.

When the display portion 7402 of the mobile phone 7400 illustrated in FIG. 7D is touched with a finger or the like, data can be input into the mobile phone 7400. Further, operations such as making a call and composing an e-mail can be performed by touch on the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a text input mode mainly for inputting text is selected for the display portion 7402 so that text displayed on a screen can be input. In this case, it is preferable to display a keyboard or number buttons on almost the entire screen of the display portion 7402.

When a detection device including a sensor for detecting inclination, such as a gyroscope or an acceleration sensor, is provided inside the mobile phone 7400, display on the screen of the display portion 7402 can be automatically changed by determining the orientation of the mobile phone 7400 (whether the mobile phone is placed horizontally or vertically for a landscape mode or a portrait mode).

The screen modes are switched by touching the display portion 7402 or operating the operation buttons 7403 of the housing 7401. The screen modes can also be switched depending on kinds of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed within a specified period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a backlight or a sensing light source which emits a near-infrared light in the display portion, an image of a finger vein, a palm vein, or the like can be taken.

Figure 7E:
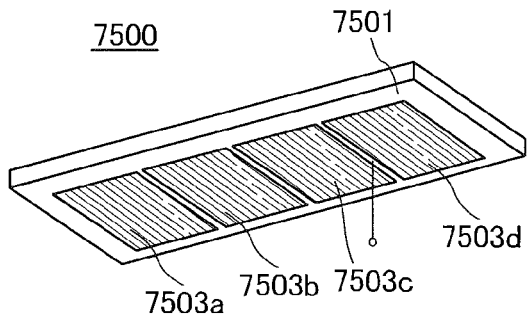

FIG. 7E illustrates an example of a lighting device. In a lighting device 7500, light-emitting devices 7503*a* to 7503*d* formed according to one embodiment of the present invention are incorporated in a housing 7501 as light sources. The lighting device 7500 can be attached to a ceiling, a wall, or the like.

The light-emitting device according to one embodiment of the present invention includes a light-emitting panel in a thin film form. Thus, when the light-emitting device is attached to a base with a curved surface, the light-emitting device with a curved surface can be obtained. In addition, when the light-emitting device is located in a housing with a curved surface, an electronic device or a lighting device with a curved surface can be obtained.

The above-described light-emitting device according to one embodiment of the present invention is provided with the light-emitting panel according to one embodiment of the present invention in which the thickness $A_1$ of the portion of the layer containing a light-emitting organic compound, which overlaps with the side surface of the partition, is smaller than ½ of the thickness $A_0$ of the portion of the layer containing a light-emitting organic compound, which is in contact with the first electrode, and the ratio ($B_1/B_0$) of the thickness $B_1$ of the portion of the second electrode, which overlaps with the side surface of the partition, to the thickness $B_0$ of the portion of the second electrode, which overlaps with the first electrode, is higher than the ratio ($A_1/A_0$). As a result, a light-emitting device in which the occurrence of crosstalk is suppressed can be provided.

This embodiment can be combined with any of the other embodiments in this specification as appropriate.

EXAMPLE

<Structure of Light-Emitting Panel>

Figure 8A:
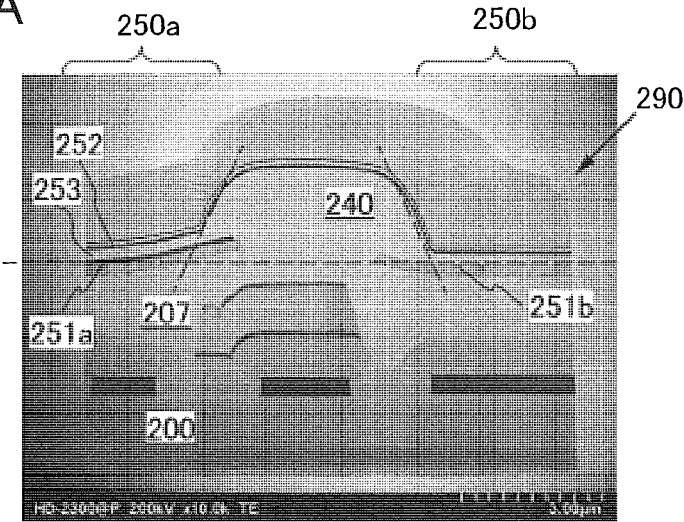
FIGS. 8A to 8C illustrate a structure of a light-emitting panel according to one example.
Figure 8B:
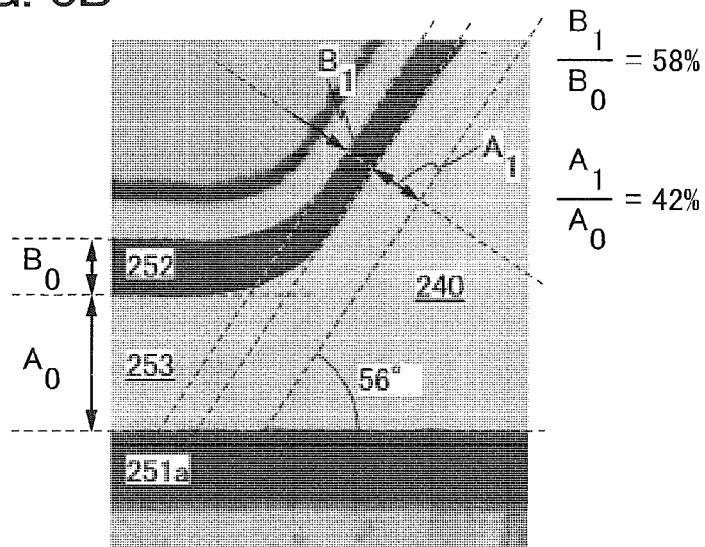
Figure 8C:
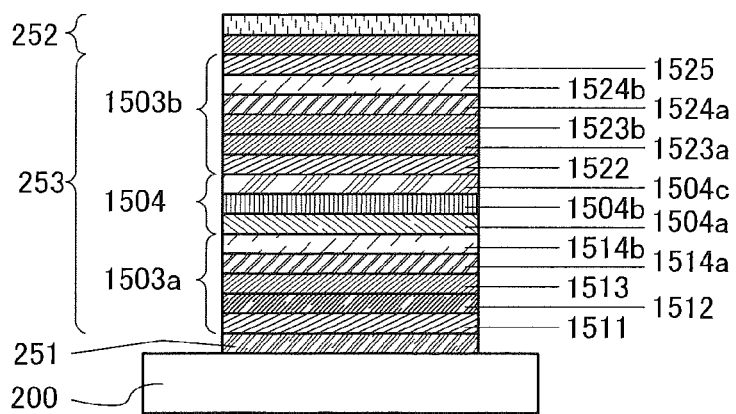

FIGS. 8A to 8C illustrate a structure of a light-emitting panel described in this example. In a light-emitting panel 290, one light-emitting element 250*a* and the other light-emitting element 250*b* are formed over a substrate 200 made of glass with an interlayer film 207 provided between the substrate 200 and the one light-emitting element 250*a* and the other light-emitting element 250*b*. Further, the partition 240 is formed between a first electrode 251*a* of the one light-emitting element 250*a* and a first electrode 251*b* of the other light-emitting element 250*b* (see FIG. 8A).

An SOI substrate was used as the substrate 200. As the SOI substrate, a 50-nm-thick single crystal silicon layer was formed over a 100-nm-thick silicon oxide film formed over a surface of a 0.7-mm-thick non-alkali glass substrate. Note that a transistor (not illustrated) was formed using the single crystal silicon layer over the substrate 200. In the transistor, a channel formation region included the single crystal silicon layer, a 40-nm-thick silicon oxynitride film was provided as a gate insulating film, and a stack of a 30-nm-thick tantalum nitride layer and a 370-nm-thick tungsten layer was provided as a gate electrode. In addition, regions to which impurities were added and which were formed in regions between which the channel formation region of the single crystal silicon layer was sandwiched were used as a source electrode and a drain electrode. In the transistor, a 50-nm-thick silicon oxynitride film was provided as a sealing film, and a 280-nm-thick silicon nitride oxide film and a 600-nm-thick silicon oxynitride film were provided thereover as an insulating film.

A wiring layer in which a 100-nm-thick titanium layer, a 900-nm-thick aluminum layer, and a 100-nm-thick titanium layer were stacked in this order was provided over the insulating film. As the interlayer film 207, a 1.4-µm-thick polyimide film was formed so as to cover the wiring layer (see FIG. 8A).

In the first electrode 251a of the one light-emitting element 250a, a stack in which a 6-nm-thick titanium film was stacked on a 200-nm-thick aluminum-titanium alloy film was used as a reflective electrode, and a 90-nm-thick indium tin oxide film containing silicon oxide (abbreviation: ITSO) was stacked thereon as an optical adjustment layer.

covered an end portion of the first electrode 251a and an end portion of the first electrode 251b.

<Structure of Layer Containing Light-Emitting Organic Compound>

FIG. 8C illustrates a structure of a layer 253 containing a light-emitting organic compound. The layer 253 containing a light-emitting organic compound had a structure in which two EL layers (a first EL layer 1503a and a second EL layer 1503b) were provided with an intermediate layer (an intermediate layer 1504) interposed therebetween (the structure is also referred to as tandem structure).

The first EL layer 1503a included a hole-injection layer 1511, a first hole-transport layer 1512, a first light-emitting layer 1513, a first electron-transport layer 1514a, and a second electron-transport layer 1514b in this order over the first electrode 251.

The intermediate layer 1504 included an electron-injection buffer 1504a, an electron-relay layer 1504b, and a charge generation region 1504c in this order over the electron-transport layer 1514b.

The second EL layer 1503b included a second hole-transport layer 1522, a second light-emitting layer 1523a, a third light-emitting layer 1523b, a third electron-transport layer 1524a, a fourth electron-transport layer 1524b, and an electron-injection layer 1525 in this order over the intermediate layer 1504.

Table 1 shows details of materials included in the EL layers.

TABLE 1

| First EL layer 1503a | | | | |
|---|---|---|---|---|
| Hole-injection | Hole-transport | | Electron-transport layer | |
| layer 1511 | layer 1512 | First light-emitting layer 1513 | 1514a | 1514b |
| PCzPA:MoOx (=2:1) 20 nm | PCzPA 20 nm | CzPA:1,6-mMemFLPAP (=1:0.05) 30 nm | CzPA 5 nm | Bphen 15 nm |

| Intermediate layer 1504 | | |
|---|---|---|
| Electron-injection buffer layer 1504a | Electron-relay layer 1504b | Charge-generation region 1504c |
| Ca 1 nm | CuPc 2 nm | PCzPA:MoOx (=2:1) 20 nm |

| Second EL layer 1503b | | | | | |
|---|---|---|---|---|---|
| Hole-transport layer 1522 | Light-emitting layer | | Electron-transport layer | | Electron-injection layer 1525 |
| | Second light-emitting layer 1523a | Third light-emitting layer 1523b | Third electron-transport layer 1524a | Fourth electron-transport layer 1524b | |
| BPAFLP 20 nm | 2mDBTPDBqII:PCBA1BP:Ir(mppm)2acac 0.8:0.2:0.06 20 nm | 2mDBTPDBqII:Ir(tppr)2dpm 1:0.02 20 nm | 2mDBTPDBqII 15 nm | Bphen 15 nm | LiF 1 nm |

In the first electrode 251b of the other light-emitting element 250b, a 6-nm-thick titanium film was stacked on a 200-nm-thick aluminum-titanium alloy film.

The partition 240 included opening portions overlapping with the first electrode 251a and the first electrode 251b and was formed using a 1.4-µm-thick polyimide film which As a second electrode 252, a conductive film in which a 70-nm-thick indium tin oxide (also referred to as ITO) film was stacked on a 15-nm-thick silver-magnesium alloy film was used. The silver-magnesium alloy film was formed by co-evaporation with the weight ratio of 10:1 (=Ag:Mg).

Structural formulas of part of the organic compounds used in this example are shown below.

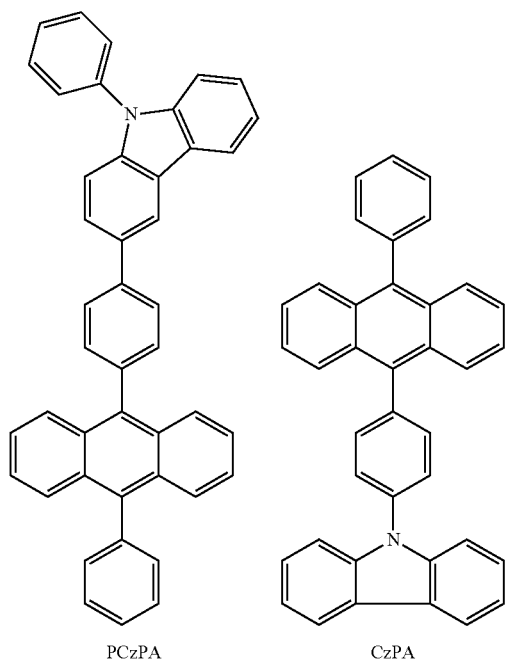
PCzPA
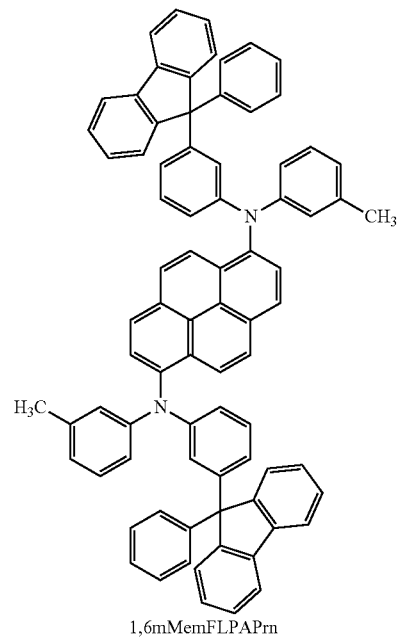
CzPA
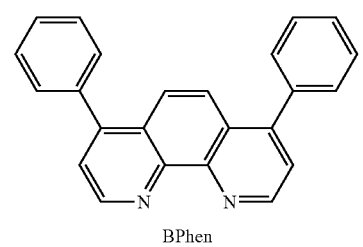
BPhen
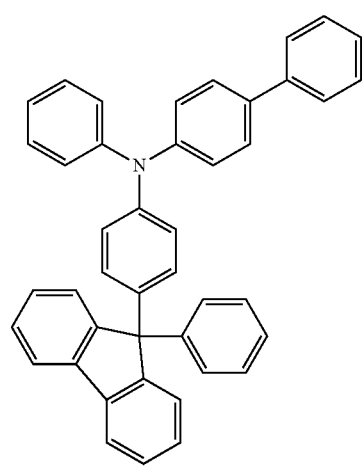
BPAFLP
-continued
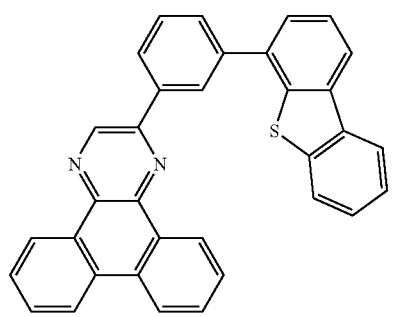
1,6mMemFLPAPrn
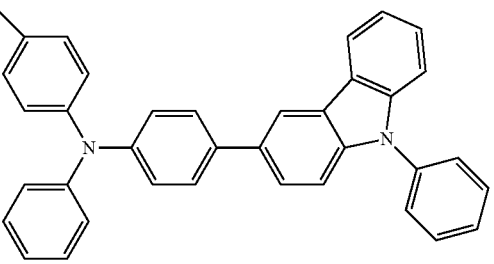
2mDBTPDBq-II
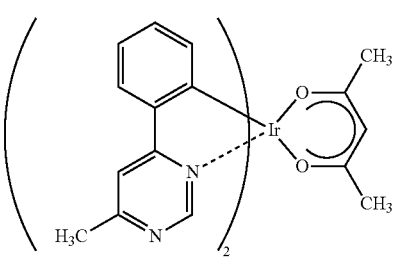
PCBA1BP
[Ir(mppm)₂(acac)]

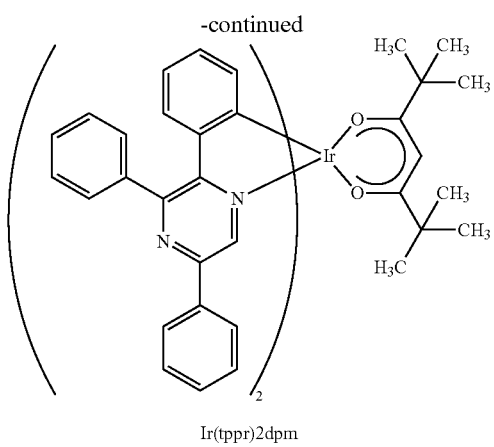

Ir(tppr)2dpm (Manufacture of Light-Emitting Panel)

Next, a method for manufacturing the light-emitting panel 290 will be described.

First, a 100-nm-thick silicon oxide film was formed over a glass substrate and a single crystal silicon layer was formed thereover, whereby an SOI substrate was formed. A known method can be employed as a method for forming a transistor over the SOI substrate provided with the single crystal silicon layer.

Next, a reflective film was formed by a sputtering method as the interlayer film 207. In this example, a stacked film of a 200-nm-thick aluminum-titanium alloy film and a 6-nm-thick titanium film thereon was used as the reflective film.

Next, an indium tin oxide containing silicon oxide (abbreviation: ITSO) film serving as an optical adjustment layer was formed over the stacked film by a sputtering method to have a desired thickness as necessary, and the first electrode 251a of the one light-emitting element 250a and the first electrode 251b of the other light-emitting element 250b were formed.

Next, the partition 240 including an opening portion was formed over the first electrode of the one light-emitting element 250a and the first electrode of the other light-emitting element 250b. A positive photosensitive polyimide was applied, light exposure was performed through a photomask, and an unnecessary portion was removed by development and then baked, so that the partition 240 was formed. Note that in the baking, a substrate was put in a baking furnace whose temperature was set at 250° C. in advance, and the substrate after the baking was taken out without a decrease in the temperature of the baking furnace.

Next, the substrate 200 made of glass was fixed to a substrate holder provided in a vacuum evaporation apparatus such that the surface on which the reflective film was formed faced downward, and the pressure was reduced to approximately $10^{-4}$ Pa.

Next, the hole-injection layer 1511 was formed over the first electrode. As the hole-injection layer 1511, a layer containing a composite material of an organic compound and an inorganic compound was formed by co-evaporation of 9-phenyl-3-[4-(10-phenyl-9-anthryl)phenyl]-9H-carbazole (abbreviation: PCzPA) and molybdenum oxide. The thickness of the layer containing a composite material was 20 nm. The weight ratio of PCzPA to molybdenum oxide was adjusted to 2:1 (=PCzPA: molybdenum oxide). Note that the co-evaporation method refers to an evaporation method in which evaporation of a plurality of materials is performed using a plurality of evaporation sources at the same time in one treatment chamber.

Next, the hole-transport layer 1512 was formed over the hole-injection layer 1511. As the hole-transport layer 1512, PCzPA was deposited to a thickness of 20 nm by an evaporation method using resistance heating.

Next, the first light-emitting layer 1513 was formed over the hole-transport layer 1512. As the first light-emitting layer 1513, 9-[4-(10-phenyl-9-anthryl)phenyl]-9H-carbazole (abbreviation: CzPA) and N,N'-bis(3-methylphenyl)-N,N'-bis[3-(9-phenyl-9H-fluoren-9-yl)phenyl]-pyrene-1,6-diamine (abbreviation: 1,6mMemFLPAPrn) were co-evaporated to a thickness of 30 nm. The evaporation rate was adjusted so that the weight ratio of CzPA to 1,6mMemFL-PAPrn was 1:0.05 (=CzPA: 1,6mMemFLPAPrn).

Next, the electron-transport layer was formed over the first light-emitting layer 1513. The electron-transport layer includes the first electron-transport layer 1514a and the second electron-transport layer 1514b. Note that CzPA was deposited to a thickness of 5 nm as the first electron-transport layer 1514a, and bathophenanthroline (abbreviation: BPhen) was deposited thereover to a thickness of 15 nm as the second electron-transport layer 1514b.

Next, the electron-injection buffer 1504a was formed over the electron-transport layer 1514. As the electron-injection buffer 1504a, calcium was deposited to a thickness of 1 nm.

Next, the electron-relay layer 1504b was formed over the electron-injection buffer 1504a. As the electron-relay layer 1504b, copper(II) phthalocyanine (abbreviation: CuPc) was deposited to a thickness of 2 nm.

Next, the charge generation region 1504c was formed over the electron-relay layer 1504b. As the charge generation region 1504c, a layer containing a composite material of an organic compound and an inorganic compound was formed by co-evaporation of PCzPA and molybdenum oxide. The thickness of the layer containing a composite material was 30 nm. The weight ratio of PCzPA to molybdenum oxide was adjusted to 2:1 (=PCzPA: molybdenum oxide).

Next, the hole-transport layer 1522 was formed over the charge generation region 1504c. As the hole-transport layer 1522, 4-phenyl-4'-(9-phenylfluoren-9-yl)triphenylamine (abbreviation: BPAFLP) was deposited to a thickness of 20 nm by an evaporation method using resistance heating.

Next, the second light-emitting layer 1523a was formed over the hole-transport layer 1522. The second light-emitting layer 1523a was formed by co-evaporation of 2-[3-(dibenzothiophen-4-yl)phenyl]dibenzo[f,h]quinoxaline (abbreviation: 2mDBTPDBq-II), 4-phenyl-4'-(9-phenyl-9H-carbazol-3-yl)triphenylamine (abbreviation: PCBA1BP), and (acetylacetonato)bis(6-methyl-4-phenylpyrimidinato)iridium(III) (abbreviation: Ir(mppm)$_2$(acac)) to a thickness of 20 nm. The evaporation rate was adjusted so that the weight ratio of 2mDBTPDBq-II to PCBA1BP and Ir(mppm)$_2$ (acac) was 0.8:0.2:0.06 (=2mDBTPDBq-II: PCBA1BP: Ir(mppm)$_2$(acac)).

Next, the third light-emitting layer 1523b was formed over the second light-emitting layer 1523a. The third light-emitting layer 1523b was formed by co-evaporation of 2mDBTPDBq-II and (dipivaloylmethanato)bis(2,3,5-triphenylpyrazinato)iridium(III) (abbreviation: Ir(tppr)$_2$(dpm)) to a thickness of 20 nm. The evaporation rate was adjusted so that the weight ratio of 2mDBTPDBq-II to Ir(tppr)$_2$(dpm) was 1:0.02 (=2mDBTPDBq-II: Ir(tppr)$_2$(dpm)).

Next, the electron-transport layer was formed over the third light-emitting layer 1523b. The electron-transport layer includes the third electron-transport layer 1524a and the fourth electron-transport layer 1524b. Note that 2mDBTP-DBq-II was formed to a thickness of 15 nm as the third electron-transport layer 1524a and BPhen was formed thereover to a thickness of 15 nm as the fourth electron-transport layer 1524b.

Next, the electron-injection layer 1525 was formed over the fourth electron-transport layer 1524b. As the electron-injection layer 1525, lithium fluoride (LiF) was evaporated to a thickness of 1 nm.

Lastly, the second electrode 252 was formed over the electron-injection layer 1525. As the second electrode 252, silver (Ag) and magnesium (Mg) were co-evaporated to a thickness of 10 nm by an evaporation method using resistance heating, and then indium tin oxide (abbreviation: ITO) was deposited to a thickness of 70 nm by a sputtering method. Through the above steps, the light-emitting panel 290 was manufactured. The evaporation rate was adjusted so that the volume ratio of Ag to Mg was 10:1 (=Ag:Mg).

Sealing was performed in a glove box in a nitrogen atmosphere so that the light-emitting panel 290 which was obtained through the above-described steps was not exposed to the air.

Subsequently, crosstalk to an adjacent light-emitting element when only a column including the one light-emitting element 250a is operated in the light-emitting panel 290 in which the light-emitting elements are provided in matrix is described. Note that the measurement was carried out at room temperature (in an atmosphere kept at 25° C.).

<Evaluation Results>

A thickness $A_1$ of a portion of the layer 253 containing a light-emitting organic compound, which overlaps with a side surface of the partition 240, was smaller than ½ of a thickness $A_0$ of a portion of the layer 253 containing a light-emitting organic compound, which is in contact with the first electrode 251a, and the ratio ($A_1/A_0$) was 42% (see FIG. 8B).

In addition, the ratio ($B_1/B_0$) of a thickness $B_1$ of a portion of the second electrode 252, which overlaps with the side surface of the partition 240, to a thickness $B_0$ of a portion of the second electrode 252, which overlaps with the first electrode 251a, was 58%, which was higher than the ratio ($A_1/A_0$) that is 42%.

Note that the angle of the side surface of the partition 240 with respect to the substrate 200 was 56°.

Figure 9B:
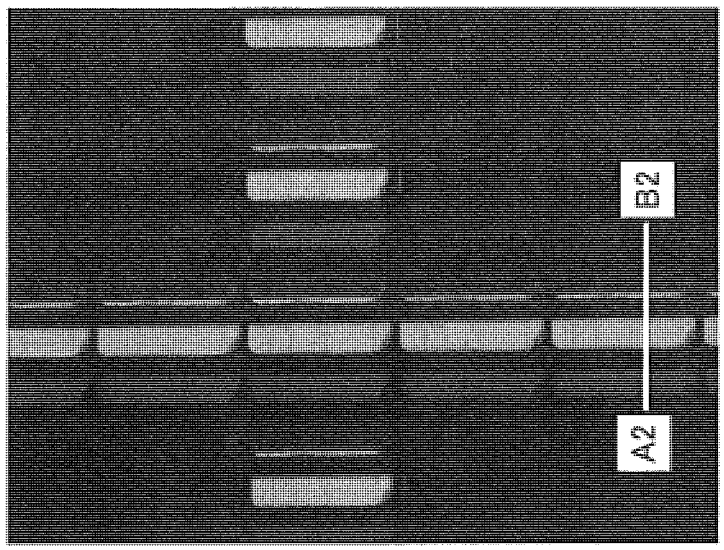
FIGS. 9A and 9B illustrate a light-emitting state of a light-emitting panel according to one example and a light-emitting state of a comparative panel of a comparative example.
Figure 9A:
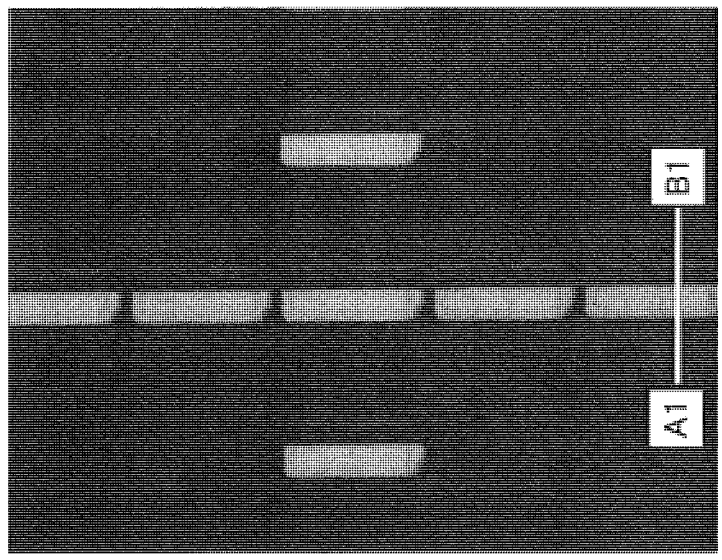

FIG. 9A shows observation results of a light-emitting state of the light-emitting panel manufactured in this example with an optical microscope and a CCD camera. In the photograph, a portion where blue pixels in one row and blue pixels in one column which are selected in accordance with an image signal and to which power is supplied by a driver circuit intersect with each other is shown. Note that a red pixel is provided on the left side of the blue pixel, and a green pixel is provided on the right side of the blue pixel. FIG. 9A shows that a red or green pixel which was adjacent to the selected blue pixel hardly emitted light, and the occurrence of crosstalk was suppressed.

Figure 10:
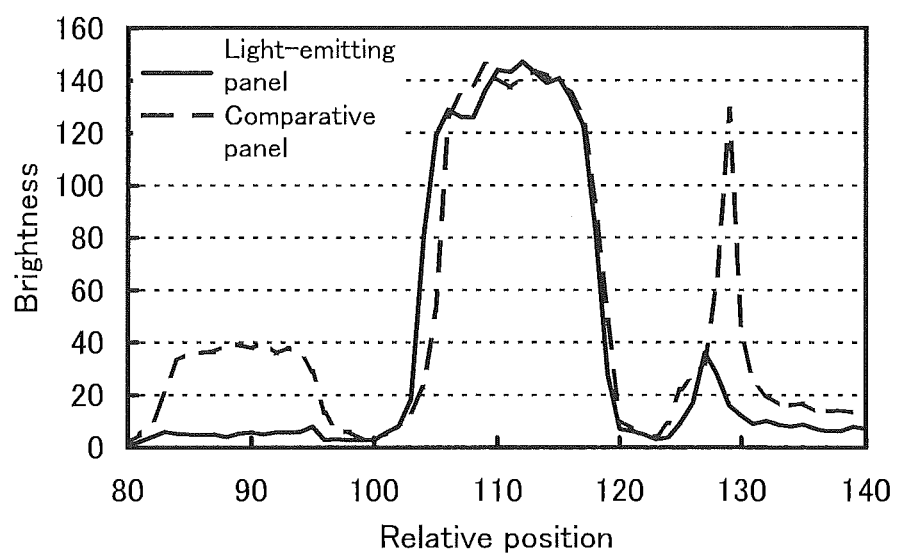
FIG. 10 illustrates a light-emitting state of a light-emitting panel according to one example and a light-emitting state of a comparative panel of a comparative example.

In FIG. 10, a solid line is obtained by plotting brightness received by a CCD camera in a line A1-B1 in FIG. 9A with respect to their positions. Note that positional information in the horizontal axis is a relative value whose unit is a pixel of the CCD camera. In addition, brightness received by the CCD camera is converted into numbers by classifying in stages with reference to black as 0 and white as 255.

Brightness observed in relative positions from (100) to (123) corresponds to a blue pixel. Brightness observed from (83) to (93) corresponds to a red pixel, and brightness observed from (123) to (133) corresponds to a green pixel. It can be confirmed from these plots that the occurrence of crosstalk is suppressed.

Comparative Example

<Structure Example of Comparative Panel>

A comparative panel described in this reference example has the same structure as the above-described light-emitting panel except the structure of a partition. Specifically, the structures of a substrate, an interlayer film, one light-emitting element, and the other light-emitting element are the same as those of the substrate, the interlayer film, the one light-emitting element, and the other light-emitting element in the above-light-emitting panel except a mode of a side surface of the partition. Therefore, description of the reference panel can be referred to for the details of portions having a structure similar to that of the above-described light-emitting panel.

The structure of the partition of the comparative panel will be described. The partition includes an opening portion overlapping with a first electrode of the one light-emitting element and a first electrode of the other light-emitting element and is formed using a 1.4-μm-thick polyimide film which covers an end portion of the first electrode of the one light-emitting element and an end portion of the first electrode of the other light-emitting element.

A method for manufacturing the partition of the comparative panel is described. Positive photosensitive polyimide was applied, light exposure was performed through a photomask, and an unnecessary portion was removed by development. Next, light exposure was performed without a photomask and then baking was performed, so that the partition was formed. By such a method, the angle formed by the side surface of the partition, which is in contact with the first electrode, and the substrate can be a gentle angle. Note that in the baking, the substrate was put in a baking furnace whose temperature was set at 250° C. in advance, and the substrate after the baking was taken out without a decrease in the temperature of the baking furnace. Specifically, the partition can be formed so that the side surface thereof is in contact with the substrate at about 35°.

<Comparison Results>

FIG. 9B shows observation results of a light-emitting state of the comparative panel manufactured in this comparative example with an optical microscope and a CCD camera. In the photograph, a portion where blue pixels in one row and blue pixels in one column which are selected in accordance with an image signal and to which power is supplied by a driver circuit intersect with each other is shown. Note that a red pixel is provided on the left side of the blue pixel, and a green pixel is provided on the right side of the blue pixel. From FIG. 9B, a red or green pixel which was adjacent to the selected blue pixel emitted light, and the occurrence of crosstalk was observed.

In FIG. 10, a dashed line obtained by plotting brightness received by a CCD camera in a line A2-B2 in FIG. 9B with respect to their positions. Note that positional information in the horizontal axis is a relative value whose unit is a pixel of the CCD camera.

Brightness observed in relative positions from (100) to (123) corresponds to a blue pixel. However, brightness observed from (81) to (97) corresponds to a red pixel, and brightness observed from (124) to (134) corresponds to a green pixel. In spite of the fact that the blue pixels are selected, green pixels and red pixels emit light having unignorable brightness and it can be confirmed that crosstalk occurs.

Reference Example

In this reference example, materials used in Example will be described.

Synthesis Example of 1,6mMemFLPAPrn

A synthesis example of N-bis(3-methylphenyl)-N,N-bis[3-(9-phenyl-9H-fluoren-9-yl)phenyl]-pyrene-1,6-diamine (abbreviation: 1,6mMemFLPAPrn) is described.

Step 1: Synthesis Method of 3-methylphenyl-3-(9-phenyl-9H-fluoren-9-yl)phenylamine (abbreviation: mMemFLPA)

Into a 200 mL three-neck flask were placed 3.2 g (8.1 mmol) of 9-(3-bromophenyl)-9-phenylfluorene and 2.3 g (24.1 mmol) of sodium tert-butoxide. The air in the flask was replaced with nitrogen. To this mixture were added 40.0 mL of toluene, 0.9 mL (8.3 mmol) of m-toluidine, and 0.2 mL of a 10% hexane solution of tri(tert-butyl)phosphine. The temperature of this mixture was set to 60° C., and 44.5 mg (0.1 mmol) of bis(dibenzylideneacetone)palladium(0) was added to the mixture. The temperature of this mixture was raised to 80° C., and the mixture was stirred for 2.0 hours. After that, the mixture was suction-filtered through Florisil (produced by Wako Pure Chemical Industries, Ltd., Catalog No. 540-00135), Celite (produced by Wako Pure Chemical Industries, Ltd., Catalog No. 531-16855), and alumina to give a filtrate. A solid obtained by concentration of the obtained filtrate was purified by silica gel column chromatography (a developing solvent in which the ratio of hexane to toluene was 1:1) and recrystallized from a mixed solvent of toluene and hexane. Accordingly, 2.8 g of a white solid of the object of the synthesis was obtained in 82% yield. The synthesis scheme of Step 1 above is shown in (J-1) below.

Step 2: Synthesis Method of N,N'-bis(3-methylphenyl)-N,N'-bis3-(9-phenyl-9H-fluoren-9-yl)phenyl-pyrene-1,6-diamine (abbreviation: 1,6mMemFLPAPrn)

Into a 100 mL three-neck flask were placed 0.6 g (1.7 mmol) of 1,6-dibromopyrene, 1.4 g (3.4 mmol) of 3-methylphenyl-3-(9-phenyl-9H-fluoren-9-yl)phenylamine, and 0.5 g (5.1 mmol) of sodium tert-butoxide. The air in the flask was replaced with nitrogen. To this mixture were added 21.0 mL of toluene and 0.2 mL of a 10% hexane solution of tri(tert-butyl)phosphine. The temperature of this mixture was set to 60° C., and 34.9 mg (0.1 mmol) of bis(dibenzylideneacetone)palladium(0) was added to the mixture.

The temperature of this mixture was raised to 80° C., and the mixture was stirred for 3.0 hours. After that, 400 mL of toluene was added to the mixture, and the mixture was heated. While kept hot, the mixture was suction-filtered through Florisil (produced by Wako Pure Chemical Industries, Ltd., Catalog No. 540-00135), Celite (produced by Wako Pure Chemical Industries, Ltd., Catalog No. 531-16855), and alumina to give a filtrate. The filtrate was concentrated to give a solid, which was then purified by silica gel column chromatography (a developing solvent in which the ratio of hexane to toluene was 3:2) to give a yellow solid. Recrystallization of the obtained yellow solid from a mixed solvent of toluene and hexane gave 1.2 g of a yellow solid of the object of the synthesis in 67% yield.

By a train sublimation method, 1.0 g of the obtained yellow solid was purified by sublimation. In the sublimation purification, the yellow solid was heated at 317° C. under a pressure of 2.2 Pa with a flow rate of argon gas of 5.0 mL/min. After the sublimation purification, 1.0 g of a yellow solid of the object of the synthesis was obtained in a yield of 93%. The synthesis scheme of Step 2 above is shown in (J-2) below.

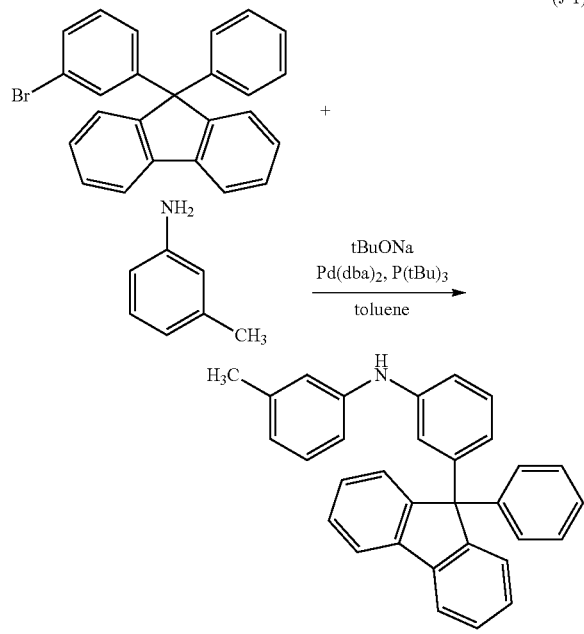

(J-1)

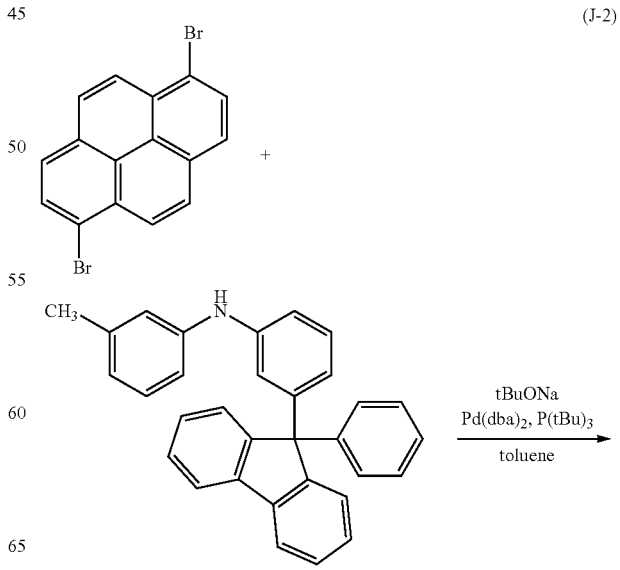

(J-2)

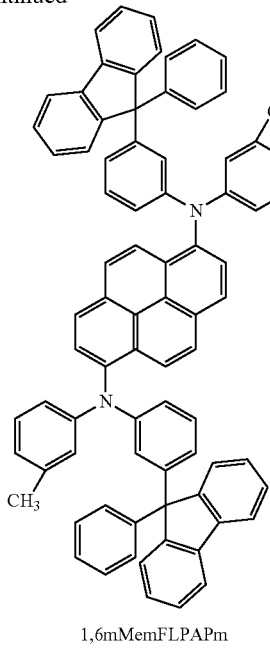

1,6mMemFLPAPm

A nuclear magnetic resonance (NMR) method identified this compound as N,N'-bis(3-methylphenyl)-N,N'-bis[3-(9-phenyl-9H-fluoren-9-yl)phenyl]-pyrene-1,6-dia mine (abbreviation: 1,6mMemFLPAPrn), which was the object of the synthesis.

$^1$H NMR data of the obtained compound is shown below.
$^1$H NMR (CDCl$_3$, 300 MHz):δ=2.21 (s, 6H), 6.67 (d, J=7.2 Hz, 2H), 6.74 (d, J=7.2 Hz, 2H), 7.17-7.23 (m, 34H), 7.62 (d, J=7.8 Hz, 4H), 7.74 (d, J=7.8 Hz, 2H), 7.86 (d, J=9.0 Hz, 2H), 8.04 (d, J=8.7 Hz, 4H).

Synthesis Example of 2mDBTPDBq-II

A synthesis example of 2-[3-(dibenzothiophen-4-yl)phenyl]dibenzo[f,h]quinoxaline (abbreviation: 2mDBTPDBq-II) is described.

Synthesis of 2mDBTPDBq-II

A scheme for the synthesis of 2mDBTPDBq-II is illustrated in (C-1).

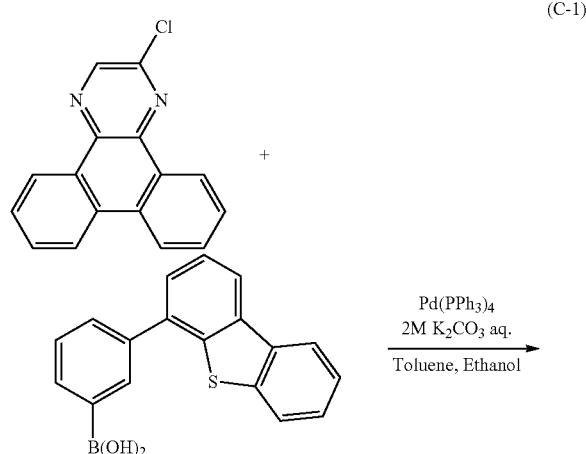

(C-1)

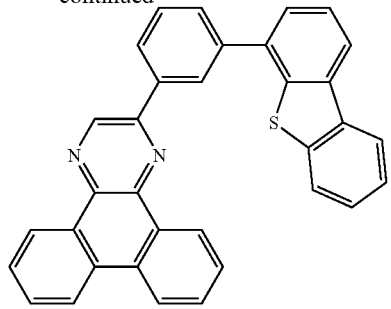

2mDBTPDBq-II

In a 2 L three-neck flask were put 5.3 g (20 mmol) of 2-chlorodibenzo[f,h]quinoxaline, 6.1 g (20 mmol) of 3-(dibenzothiophen-4-yl)phenylboronic acid, 460 mg (0.4 mmol) of tetrakis(triphenylphosphine)palladium(0), 300 mL of toluene, 20 mL of ethanol, and 20 mL of a 2M aqueous potassium carbonate solution. The mixture was degassed by being stirred under reduced pressure. The air in the flask was replaced with nitrogen. This mixture was stirred under a nitrogen stream at 100° C. for 7.5 hours. After cooled to room temperature, the obtained mixture was filtered to give a white substance. The obtained substance by the filtration was washed with water and ethanol in this order, and then dried. The obtained solid was dissolved in about 600 mL of hot toluene, followed by suction filtration through Celite (produced by Wako Pure Chemical Industries, Ltd., Catalog No. 531-16855) and Florisil (produced by Wako Pure Chemical Industries, Ltd., Catalog No. 540-00135), whereby a clear colorless filtrate was obtained. The obtained filtrate was concentrated and purified by silica gel column chromatography. The chromatography was carried out using hot toluene as a developing solvent. Acetone and ethanol were added to the solid obtained here, followed by irradiation with ultrasonic waves. Then, the generated suspended solid was filtered and the obtained solid was dried to give 7.85 g of a white powder in 80% yield, which was the substance to be produced.

The above produced substance was relatively soluble in hot toluene, but is a material that is easy to precipitate when cooled. Further, the substance was poorly soluble in other organic solvents such as acetone and ethanol. Hence, the utilization of these different degrees of solubility resulted in a high-yield synthesis by a simple method as above. Specifically, after the reaction finished, the mixture was returned to room temperature and the precipitated solid was collected by filtration, whereby most impurities were able to be easily removed. Further, by the column chromatography with hot toluene as a developing solvent, the produced substance, which is easy to precipitate, was able to be readily purified.

By a train sublimation method, 4.0 g of the obtained white powder was purified. In the purification, the white powder was heated at 300° C. under a pressure of 5.0 Pa with a flow rate of argon gas of 5 mL/min. After the purification, 3.5 g of a white powder was obtained in a yield of 88%, which was the substance to be produced.

A nuclear magnetic resonance (NMR) method identified this compound as 2-[3-(dibenzothiophen-4-yl)phenyl]dibenzo[fh]quinoxaline (abbreviation: 2mDBTPDBq-II), which was the substance to be produced.

$^1$H NMR data of the obtained substance are as follows. $^1$H NMR (CDCl$_3$, 300 MHz):δ (ppm)=7.45-7.52 (m, 2H), 7.59-7.65 (m, 2H), 7.71-7.91 (m, 7H), 8.20-8.25 (m, 2H), 8.41 (d, J=7.8 Hz, 1H), 8.65 (d, J=7.5 Hz, 2H), 8.77-8.78 (m, 1H), 9.23 (dd, J=7.2 Hz, 1.5 Hz, 1H), 9.42 (dd, J=7.8 Hz, 1.5 Hz, 1H), 9.48 (s, 1H).

Synthesis Example of [Ir(mppm)$_2$(acac)]

A synthesis example of (acetylacetonato)bis(6-methyl-4-phenylpyrimidinato)iridium(III) (abbreviation: [Ir(mppm)$_2$(acac)]) is described.

Step 1: Synthesis of 4-methyl-6-phenylpyrimidine (abbreviation: Hmppm)

First, in a recovery flask equipped with a reflux pipe were put 4.90 g of 4-chloro-6-methylpyrimidine, 4.80 g of phenylboronic acid, 4.03 g of sodium carbonate, 0.16 g of bis(triphenylphosphine)palladium(II) dichloride (abbreviation: Pd(PPh$_3$)$_2$Cl$_2$), 20 mL of water, and 10 mL of acetonitrile, and the air in the flask was replaced with argon. This reaction container was subjected to irradiation with microwaves (2.45 GHz, 100 W) for 60 minutes to be heated. Here, in the flask were further put 2.28 g of phenylboronic acid, 2.02 g of sodium carbonate, 0.082 g of Pd(PPh$_3$)$_2$Cl$_2$, 5 mL of water, and 10 mL of acetonitrile, and the mixture was heated again by irradiation with microwaves (2.45 GHz, 100 W) for 60 minutes. After that, water was added to this solution and extraction with dichloromethane was carried out. The obtained solution of the extract was washed with a saturated sodium carbonate aqueous solution, water, and then with saturated saline, and dried with magnesium sulfate. The solution which had been dried was filtered. The solvent of this solution was distilled off, and then the obtained residue was purified by silica gel column chromatography using dichloromethane and ethyl acetate as a developing solvent in a volume ratio of 9:1, so that a pyrimidine derivative Hmppm, which was the objective substance, was obtained (orange oily substance, yield of 46%). Note that the irradiation with microwaves was performed using a microwave synthesis system (Discover, manufactured by CEM Corporation). A synthesis scheme (b-1) of Step 1 is shown below.

(b-1)

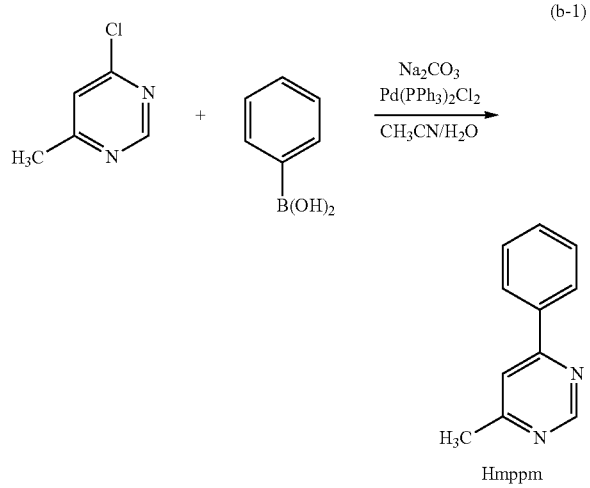

Step 2: Synthesis of Di-μ-chloro-bis bis(6-methyl-4-phenylpyrimidinato)iridium(III) (abbreviation: [Ir(mppm)$_2$Cl]$_2$)]

Next, in a recovery flask equipped with a reflux pipe were put 15 mL of 2-ethoxyethanol, 5 mL of water, 1.51 g of Hmppm obtained in Step 1 above, and 1.26 g of iridium chloride hydrate (IrCl$_3$.H$_2$O), and the air in the flask was replaced with argon. After that, irradiation with microwaves (2.45 GHz, 100 W) was performed for 1 hour to cause a reaction. The solvent was distilled off, and then the obtained residue was washed with ethanol and filtered to give a dinuclear complex [Ir(mppm)$_2$Cl]$_2$ (dark green powder, yield of 77%). A synthesis scheme (b-2) of Step 2 is shown below.

Step 3: Synthesis of (acetylacetonato)bis(6-methyl-4-phenylpyrinidinato)iridium(III) (abbreviation: [Ir(mppm)$_2$(acac)])

Furthermore, into a recovery flask equipped with a reflux pipe were put 40 mL of 2-ethoxyethanol, 1.84 g of the dinuclear complex [Ir(mppm)$_2$Cl]$_2$ obtained in Step 2, 0.48 g of acetylacetone, and 1.73 g of sodium carbonate, and the air in the recovery flask was replaced with argon. Then, irradiation with microwaves (2.45 GHz, 100 W) for 60 minutes was performed to cause a reaction. The solvent was distilled off, the obtained residue was dissolved in dichloromethane, and filtration was performed to remove insoluble matter. The obtained filtrate was washed with water and saturated saline, and was dried with magnesium sulfate. The solution which had been dried was filtered. The solvent of this solution was distilled off, and then the obtained residue was purified by silica gel column chromatography using dichloromethane and ethyl acetate as a developing solvent in a volume ratio of 4:1. After that, recrystallization was carried out with a mixed solvent of dichloromethane and hexane to give a yellow powder that was the object of the synthesis (44% yield). A synthesis scheme (b-3) of Step 3 is shown below.

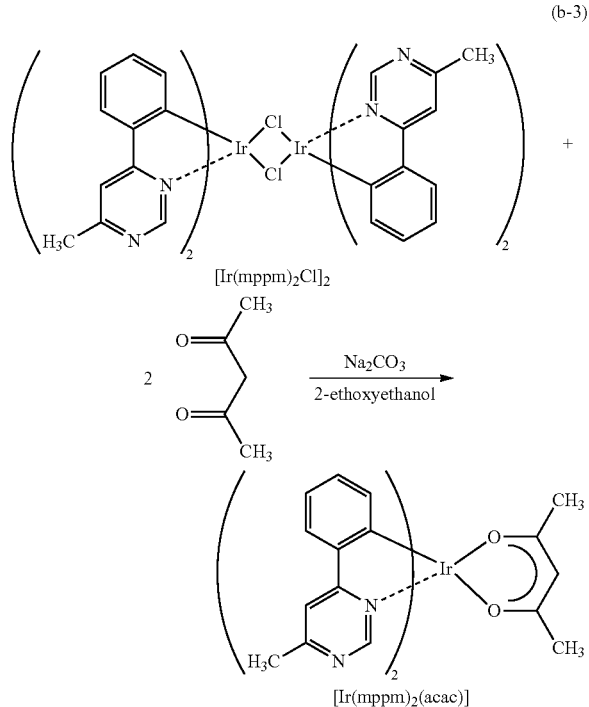

Analysis results by nuclear magnetic resonance spectrometry ($^1$H-NMR) of the yellow powder obtained in Step 3 are shown below. The result shows that this compound was (acetylacetonato)bis(6-methyl-4-phenylpyrimidinato)iridium(III) (abbreviation: [Ir(mppm)$_2$(acac)], which was the objective substance.

$^1$H NMR. δ (CDCl$_3$): 1.78 (s, 6H), 2.81 (s, 6H), 5.24 (s, 1H), 6.37 (d, 2H), 6.77 (t, 2H), 6.85 (t, 2H), 7.61-7.63 (m, 4H), 8.97 (s, 2H).

This application is based on Japanese Patent Application serial no. 2011-141001 filed with Japan Patent Office on Jun. 24, 2011, the entire contents of which are hereby incorporated by reference.

What is claimed is:

1. A light-emitting panel comprising:
   a substrate;
   at least two light-emitting elements adjacent to each other over the substrate;
   at least two first electrodes adjacent to each other over the substrate;
   a partition over the substrate, between the at least two light-emitting elements and between the at least two first electrodes, a side surface of the partition forming an angle of greater than or equal to 55° and less than or equal to 100° with the substrate;
   a layer containing a light-emitting compound over the at least two first electrodes and the partition; and
   a second electrode over the layer containing the light-emitting compound, the second electrode overlapping the at least two first electrodes,
   wherein the at least two light-emitting elements comprise each the second electrode, the layer containing the light-emitting compound, and a corresponding one of the at least two first electrodes,
   wherein the layer containing the light-emitting compound includes a portion of a thickness $A_0$ over one of the at least two first electrodes, and a portion of a thickness $A_1$ over a side surface of the partition, the thickness $A_1$ being smaller than the thickness $A_0$,
   wherein the second electrode includes a portion of a thickness $B_0$ over the one of the at least two first electrodes, and a portion of a thickness $B_1$ over the side surface of the partition, a ratio $B_1/B_0$ being higher than a ratio $A_1/A_0$,
   wherein a portion of the layer containing the light-emitting compound overlapping with a top surface of the partition is thicker than the portion of the thickness $A_1$ over the side surface of the partition.

2. The light-emitting panel according to claim 1, wherein the side surface forms an angle of greater than or equal to 55° and less than or equal to 90° with the substrate.

3. The light-emitting panel according to claim 1, wherein $B_1$ is greater than $B_0$.

4. The light-emitting panel according to claim 1, further comprising a spacer formed over the partition, wherein the spacer is covered with the layer containing the light-emitting compound and the second electrode.

5. The light-emitting panel according to claim 1, wherein the layer containing the light-emitting compound is formed by a deposition method having directivity.

6. The light-emitting panel according to claim 5, wherein the deposition method has directivity in a direction vertical to the at least two first electrodes.

7. A light-emitting device comprising the light-emitting panel according to claim 1.

8. A light-emitting panel comprising:
   a substrate;
   at least two light-emitting elements adjacent to each other over the substrate;
   at least two first electrodes adjacent to each other over the substrate;
   a partition over the substrate, between the at least two light-emitting elements and between the at least two first electrodes, a side surface of the partition forming an angle of greater than or equal to 55° and less than or equal to 100° with the substrate;
   a layer containing a light-emitting compound over the at least two first electrodes and the partition; and
   a second electrode over the layer containing the light-emitting compound, the second electrode overlapping the at least two first electrodes,
   wherein the at least two light-emitting elements comprise each the second electrode, the layer containing the light-emitting compound, and a corresponding one of the at least two first electrodes,
   wherein the layer containing the light-emitting compound includes a portion of a thickness $A_0$ over one of the at least two first electrodes, and a portion of a thickness $A_1$ over a side surface of the partition, the thickness $A_1$ being smaller than half of the thickness $A_0$,
   wherein the second electrode includes a portion of a thickness $B_0$ over the one of the at least two first electrodes, and a portion of a thickness $B_1$ over the side surface of the partition, a ratio $B_1/B_0$ being higher than a ratio $A_1/A_0$,
   wherein a portion of the layer containing the light-emitting compound overlapping with a top surface of the partition is thicker than the portion of the thickness $A_1$ over the side surface of the partition.

9. The light-emitting panel according to claim 8, wherein the side surface forms an angle of greater than or equal to 55° and less than or equal to 90° with the substrate.

10. The light-emitting panel according to claim 8, wherein $B_1$ is greater than $B_0$.

11. The light-emitting panel according to claim 8, further comprising a spacer formed over the partition,
wherein the spacer is covered with the layer containing the light-emitting compound and the second electrode.

12. The light-emitting panel according to claim 8, wherein the layer containing the light-emitting compound is formed by a deposition method having directivity.

13. The light-emitting panel according to claim 12, wherein the deposition method has directivity in a direction vertical to the at least two first electrodes.

14. A light-emitting device comprising the light-emitting panel according to claim 8.

15. A display device comprising:
a substrate;
a driver circuit portion over the substrate;
a pixel portion;
at least two light-emitting elements adjacent to each other over the substrate, in the pixel portion, and configured to be controlled by the driver circuit portion;
at least two first electrodes adjacent to each other over the substrate;
a partition over the substrate, between the at least two light-emitting elements and between the at least two first electrodes, a side surface of the partition forming an angle of greater than or equal to 55° and less than or equal to 100° with the substrate;
a layer containing a light-emitting compound over the at least two first electrodes and the partition; and
a second electrode over the layer containing the light-emitting compound, the second electrode overlapping the at least two first electrodes,
wherein the at least two light-emitting elements comprise each the second electrode, the layer containing the light-emitting compound, and a corresponding one of the at least two first electrodes,
wherein the layer containing the light-emitting compound includes a portion of a thickness $A_0$ over one of the at least two first electrodes, and a portion of a thickness $A_1$ over a side surface of the partition, the thickness $A_1$ being smaller than half of the thickness $A_0$,
wherein the second electrode includes a portion of a thickness $B_0$ over the one of the at least two first electrodes, and a portion of a thickness $B_1$ over the side surface of the partition, a ratio $B_1/B_0$ being higher than a ratio $A_1/A_0$,
wherein a portion of the layer containing the light-emitting compound overlapping with a top surface of the partition is thicker than the portion of the thickness $A_1$ over the side surface of the partition.

16. The light-emitting panel according to claim 15, wherein the side surface forms an angle of greater than or equal to 55° and less than or equal to 90° with the substrate.

17. The light-emitting panel according to claim 15, wherein $B_1$ is greater than $B_0$.

18. The light-emitting panel according to claim 15, further comprising a spacer formed over the partition,
wherein the spacer is covered with the layer containing the light-emitting compound and the second electrode.

19. The light-emitting panel according to claim 15, wherein the layer containing the light-emitting compound is formed by a deposition method having directivity.

20. The light-emitting panel according to claim 19, wherein the deposition method has directivity in a direction vertical to the at least two first electrodes.

* * * * *